United States Patent
Ho et al.

(10) Patent No.: US 10,731,004 B2
(45) Date of Patent: Aug. 4, 2020

(54) POLYIMIDE PRECURSOR COMPOSITION AND USE THEREOF

(71) Applicant: ETERNAL MATERIALS CO., LTD., Kaohsiung (TW)

(72) Inventors: Chang-Hong Ho, Kaohsiung (TW); Chung-Jen Wu, Kaohsiung (TW); Meng-Yen Chou, Kaohsiung (TW); Shun-Jen Chiang, Kaohsiung (TW); Po-Yu Huang, Kaohsiung (TW); Chung-Kai Cheng, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 15/826,871

(22) Filed: Nov. 30, 2017

(65) Prior Publication Data

US 2018/0148541 A1 May 31, 2018

(30) Foreign Application Priority Data

Nov. 30, 2016 (TW) .............................. 105139585 A

(51) Int. Cl.
| | | |
|---|---|---|
| *C08G 73/10* | (2006.01) | |
| *C08G 18/10* | (2006.01) | |
| *C08G 18/34* | (2006.01) | |
| *C08L 79/08* | (2006.01) | |
| *B32B 37/00* | (2006.01) | |
| *B32B 38/10* | (2006.01) | |
| *B32B 38/00* | (2006.01) | |
| *H05K 1/03* | (2006.01) | |
| *C08G 73/12* | (2006.01) | |
| *C09D 179/08* | (2006.01) | |
| *H05K 3/28* | (2006.01) | |
| *B32B 38/16* | (2006.01) | |

(52) U.S. Cl.
CPC ........ *C08G 73/1042* (2013.01); *B32B 37/187* (2013.01); *B32B 38/10* (2013.01); *B32B 38/164* (2013.01); *C08G 18/10* (2013.01); *C08G 18/346* (2013.01); *C08G 18/348* (2013.01); *C08G 73/105* (2013.01); *C08G 73/1071* (2013.01); *C08G 73/122* (2013.01); *C08L 79/085* (2013.01); *C09D 179/08* (2013.01); *H05K 1/0346* (2013.01); *B32B 38/004* (2013.01); *B32B 2038/168* (2013.01); *B32B 2307/408* (2013.01); *B32B 2379/08* (2013.01); *B32B 2457/08* (2013.01); *H05K 1/0393* (2013.01); *H05K 3/281* (2013.01); *H05K 3/287* (2013.01); *H05K 2201/0154* (2013.01); *H05K 2203/1545* (2013.01)

(58) Field of Classification Search
CPC .............. C08G 73/1042; C08G 73/105; C08G 73/1071; C08G 73/122; C08G 18/346; C08G 18/10; C08G 18/348; C09D 179/08; B32B 38/10; B32B 38/164; B32B 37/187; B32B 2038/168; B32B 2307/408; B32B 2457/08; B32B 38/004; B32B 2379/08; C08L 79/085; H05K 1/0346; H05K 2201/0154; H05K 3/281; H05K 2203/1545; H05K 3/287; H05K 1/0393
USPC .......................................................... 528/353
See application file for complete search history.

(56) References Cited

U.S. PATENT DOCUMENTS

| | | | |
|---|---|---|---|
| 3,993,630 A | 11/1976 | Darmory et al. | |
| 5,382,367 A | 1/1995 | Zinkan et al. | |
| 5,382,637 A * | 1/1995 | Angelopoulos | C08G 73/101 522/146 |

(Continued)

FOREIGN PATENT DOCUMENTS

| | | |
|---|---|---|
| JP | 2009052642 A | 3/2009 |
| TW | 200819477 A | 5/2008 |
| TW | 201604227 A | 2/2016 |

OTHER PUBLICATIONS

CAS reg. No. 84-67-3, Nov. 16, 1984. (Year: 1984).*

(Continued)

*Primary Examiner* — Douglas J McGinty
(74) *Attorney, Agent, or Firm* — Ladas & Parry LLP

(57) ABSTRACT

The present invention provides a polyimide precursor composition comprising an amic acid ester oligomer of Formula (1):

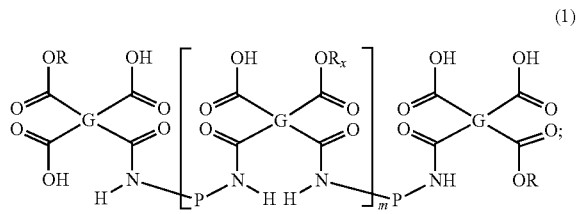

and
a diamine of Formula (2) or (3):

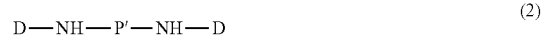

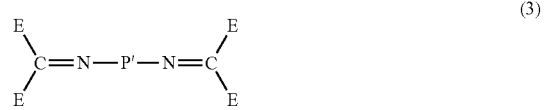

wherein G, P, R, $R_x$, P', D, E and m are as defined herein. The present invention also provides a dry film containing the polyimide precursor composition, as well as a polyimide film and polyimide laminate prepared from the composition.

20 Claims, 1 Drawing Sheet

(56) References Cited

U.S. PATENT DOCUMENTS

| | | | | |
|---|---|---|---|---|
| 9,334,369 B2* | 5/2016 | Cheng | ............... | C07D 233/90 |
| 2008/0096997 A1* | 4/2008 | Wu | ............... | C07C 233/78 |
| | | | | 522/36 |
| 2008/0103275 A1* | 5/2008 | Wu | ............... | C08F 290/06 |
| | | | | 526/245 |
| 2010/0168265 A1* | 7/2010 | Wu | ............... | C08G 73/1042 |
| | | | | 522/33 |
| 2012/0235315 A1* | 9/2012 | Wu | ............... | H01L 21/6835 |
| | | | | 264/104 |
| 2013/0172494 A1* | 7/2013 | Cheng | ............... | C07D 233/90 |
| | | | | 525/421 |
| 2013/0172569 A1 | 7/2013 | Cheng et al. | | |
| 2016/0017105 A1* | 1/2016 | Wu | ............... | B32B 37/003 |
| | | | | 156/60 |
| 2016/0369056 A1* | 12/2016 | Wu | ............... | C08G 73/106 |
| 2018/0002567 A1* | 1/2018 | Huang | ............... | H05K 3/282 |
| 2018/0148541 A1* | 5/2018 | Ho | ............... | C08G 73/122 |
| 2018/0148544 A1* | 5/2018 | Ho | ............... | C08G 69/44 |
| 2018/0194899 A1* | 7/2018 | Huang | ............... | G03F 7/0046 |
| 2018/0282482 A1* | 10/2018 | Chou | ............... | C08G 73/0273 |
| 2018/0282577 A1* | 10/2018 | Cheng | ............... | C09J 7/35 |
| 2020/0055986 A1* | 2/2020 | Wu | ............... | C08G 73/1025 |

OTHER PUBLICATIONS

Taiwanese Office Action dated Aug. 9, 2017 for Taiwanese Application No. 105139585.
Espacenet English abstract of TW 200819477 A.
Espacenet English abstract of TW 201604227 A.
Kreuz, J. A., "Polyimidizations from acylated diamines and dianhydrides", Polymer, vol. 36, No. 10, Nov. 10, 1995, pp. 2089-2094.
Machine English translation of JP2009052042A.
Office Action with English translation issued in foreign counterpart Korean patent application No. 10-2017-0163775.

* cited by examiner

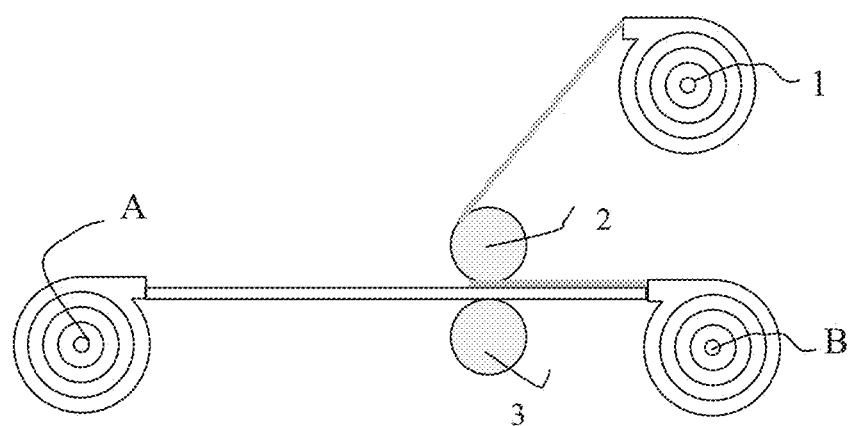

POLYIMIDE PRECURSOR COMPOSITION AND USE THEREOF

BACKGROUND OF THE INVENTION

1. Field of the Invention

The present invention relates to a polyimide (PI) precursor composition, a dry film comprising the polyimide precursor composition, and a polyimide film and a polyimide laminate prepared with the polyimide precursor composition.

2. Description of the Related Art

Polyimide is always a preferential high-performance polymer material due to its excellent thermal stability and good mechanical, electrical, and chemical properties. Polyimide is important in applications such as integrated circuit industry, electronic package, enameled wire, printed circuit boards, sensing elements, separation membranes and structural materials, and serves as a key material.

It has been emphasized that electronic products should be lighter, thinner, shorter and smaller, and thus the size of various electronic parts and components has to be reduced much more. Under such a development trend, there is more room to develop a flexible printed circuit (FPC) board which has lightness, thinness, high temperature resistance and other characteristics and may be produced massively. FPCs are widely used in 3C products, optical lens modules, LCD modules, solar cells, and other products. The flexible printed circuit board may be found in various electronic products which are popular nowadays, such as mobile phones, liquid crystal displays, and organic light-emitting diodes.

The flexible printed circuit board is produced by arranging circuits and other electronic components on a flexible substrate, which, compared to a printed circuit board using a conventional silicon substrate or glass substrate, has better flexibility, and thus may also be referred to as a flexible board. Usually, a coverlay is applied to a surface of the flexible board as an insulation protection layer to protect copper circuits on the surface of the flexible board and improve the bending-proof performance of the circuit. A suitable material of the coverlay is required to have better heat resistance, dimensional stability, insulation performance, and chemical resistance. Polyimide is a good coverlay material.

There is a persistent need in the art to develop various polyimide materials to meet the needs of different processes and it is desired to enhance the stability and physical properties of polyimides or their precursors. However, in a conventional polyimide precursor composition, a diamine monomer is liable to react with the backbone of an amic acid oligomer, causing the change of the molecular weight of the amic acid oligomer, such that the operation stability is poor and the physical properties are uneasy to control. Further, when used in a photosensitive application, the diamine monomer causes free radicals to deactivate, so a higher exposure energy is needed or even failure to sense the light is caused.

In view of this, the present invention provides a novel polyimide material having excellent storage stability and good operability, and the polyimide prepared therewith has excellent physical properties, so as to solve the above problems.

SUMMARY OF THE INVENTION

The present invention provides a polyimide precursor composition comprising an amic acid ester oligomer of Formula (1):

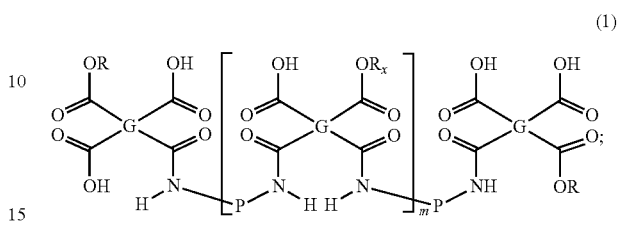

and
a diamine of Formula (2) or (3):

wherein:
G is each independently a tetravalent organic group;
P is each independently a divalent organic group;
R is each independently $C_1$-$C_{14}$ alkyl; $C_6$-$C_{14}$ aryl unsubstituted or substituted with one or more groups selected from hydroxyl and $C_1$-$C_4$ alkyl; or a group having an ethylenically unsaturated bond;
$R_x$ is each independently H, $C_1$-$C_8$ alkyl, or an ethylenically unsaturated group;
P' is each independently a divalent organic group;
D is each independently $C_1$-$C_8$ alkyl unsubstituted or substituted with one or more groups selected from $C_6$-$C_{14}$ aryl and a heterocyclyl group containing nitrogen; $C_1$-$C_8$ haloalkyl; a heterocyclyl group containing oxygen unsubstituted or substituted with one or more groups selected from $C_1$-$C_8$ alkyl and $C_1$-$C_8$ hydroxyalkyl; a heterocyclyl group containing nitrogen unsubstituted or substituted with one or more groups selected from oxo, $C_1$-$C_8$ alkyl, and —$NO_2$;

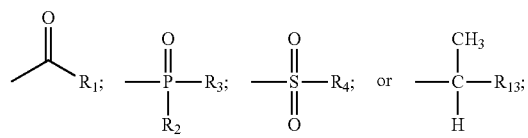

$R_1$ is H; $C_6$-$C_{14}$ aryl unsubstituted or substituted with one or more groups selected from $C_1$-$C_8$ alkyl and $C_1$-$C_8$ haloalkyl; a heterocyclyl group containing nitrogen; $C_4$-$C_{10}$ cycloalkyl; $C_1$-$C_8$ alkyl or $C_1$-$C_8$ alkoxy unsubstituted or substituted with one or more groups selected from $C_6$-$C_{14}$ aryl, a heterocyclyl group containing nitrogen, —S—$R_4$,

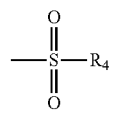

and —CN; $C_1$-$C_8$ haloalkyl; $C_1$-$C_8$ haloalkoxy; or —$NR_5R_6$; $R_{13}$ is

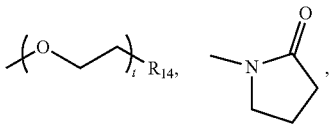

—$OR_{15}$ or $C_1$-$C_{10}$ alkoxy;
$R_2$, $R_3$, $R_4$, $R_5$ and $R_6$ may be the same or different and are each independently H; $C_1$-$C_8$ alkyl or $C_1$-$C_8$ alkoxy unsubstituted or substituted with one or more $C_6$-$C_{14}$ aryl; $C_6$-$C_{14}$ aryl or $C_6$-$C_{14}$ aryloxy unsubstituted or substituted with one or more groups selected from $C_1$-$C_8$ alkyl and —$NO_2$; halo; $C_1$-$C_8$ haloalkyl; or a heterocyclyl group containing nitrogen;
$R_{14}$ is (meth)acryloyloxy;
$R_{15}$ is a $C_4$-$C_{10}$ cycloalkyl or a heterocyclyl group containing oxygen;
t is an integer from 1 to 20;
E is each independently H; $C_1$-$C_{14}$ alkyl; alkylamino; alkylthio; $C_4$-$C_{10}$ cycloalkyl; a heterocyclyl group containing nitrogen or

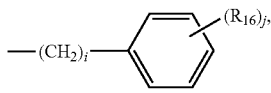

with the provision that two E attached to the same carbon atom are not H at the same time;
or alternatively, two E attached to the same carbon atom form, together with the carbon atom, a $C_6$-$C_{14}$ aryl group or a heterocyclyl group;
$R_{16}$ is each independently halo, hydroxyl, $C_1$-$C_8$ alkoxy, $C_1$-$C_8$ haloalkyl, or —$NO_2$;
i is an integer from 0 to 3;
j is an integer from 0 to 3, and
m is an integer from 1 to 100.

The present invention provides a dry film containing the polyimide precursor composition.

The present invention provides a polyimide film or polyimide laminate prepared from the polyimide precursor composition.

BRIEF DESCRIPTION OF THE DRAWINGS

FIG. 1 is a schematic diagram of a roll-to-roll process.

PREFERRED EMBODIMENT OF THE PRESENT INVENTION

In the present invention, the term "alkyl" refers to linear or branched saturated hydrocarbon groups, examples thereof including, but not limited to, methyl, ethyl, propyl (for example, n-propyl or isopropyl), butyl (for example, n-butyl, isobutyl or tert-butyl), pentyl, hexyl and the like. Unless otherwise specified, in the present invention the "alkyl" can be substituted or unsubstituted. The substituents include, for example, but not limited to, halogen, hydroxyl, —CN, $C_6$-$C_{14}$ aryl, 5- or 6-membered heterocyclyl group containing nitrogen and so on.

In the present invention, the term "aryl" refers to, for example, aromatic carbon ring to systems of monocyclic ring, bicyclic ring or tricyclic ring having 6 to 14 carbon atoms, examples thereof including, but not limited to, phenyl, indenyl, naphthyl, fluorenyl, anthryl, phenanthryl and the like. Unless otherwise specified, in the present invention the "aryl" can be substituted or unsubstituted. The substituents include, for example, but not limited to, halogen, hydroxyl, —$NO_2$, alkyl and so on.

In the present invention, the term "arylalkyl" refers to a group constituted of an aryl and an alkyl. The group can be bonded to other group through the aryl or alkyl. Examples thereof include, but not limited to, 3-methylphenyl, 4-methylphenyl or the like. Unless otherwise specified, the "aryl" part and "alkyl" part can be substituted or unsubstituted. The substituents are such as those as described above.

In the present invention, the term "halogen" means fluorine, chlorine, bromine or iodine, preferably fluorine, chlorine or bromine.

In the present invention, the term "alkoxy" refers to —O-alkyl, examples thereof including, but not limited to, methoxy, ethoxy, propoxy, isopropoxy, n-butoxy, isobutoxy, tert-butoxy, pentyloxy, hexyloxy and the like. Unless otherwise specified, the "alkyl" part can be substituted or unsubstituted. The substituents are such as those as described above.

In the present invention, the term "heterocyclyl" refers to saturated, partially saturated (such as those named by dihydro-, trihydro-, tetrahydro- or hexahydro- in the prefix) or unsaturated 3- to 14-membered rings, preferably 4- to 10-membered rings, more preferably 5- to 6-membered rings, constituted of carbon atoms and at least one hetero atom selected from N, O or S. Preferably, it has 1 to 4 hetero atoms; more preferably, it has 1 to 3 hetero atoms. The heterocyclyl covers ring systems of monocyclic ring, bicyclic ring or tricyclic ring, which include fused rings (for example, a fused ring formed by a heterocyclyl together with another heterocyclyl or aromatic carbon ring). Unless otherwise specified, in the present invention, the "heterocyclyl" can be substituted or unsubstituted. The substituents include, for example, but not limited to, halogen, hydroxyl, oxo, alkyl, hydroxyalkyl, —$NO_2$ and so on.

In the present invention, the term "heterocyclyl group containing nitrogen" refers to a 3- to 14-membered heterocyclyl, preferably 4- to 10-membered heterocyclyl, more preferably 5- to 6-membered heterocyclyl, in which at least one carbon atom of the ring is replaced by an N atom. Examples thereof include, but are not limited to, pyrrolyl, imidazolyl, pyrazolyl, pyrimidinyl, thiazolyl, pyridyl, indolyl, isoindolyl, benzimidazolyl, benzothiazolyl, quinolyl, isoquinolyl and the like. Unless otherwise specified, in the present invention, a heterocyclyl group containing nitrogen can be substituted or unsubstituted. The substituents are such as those as described above for "heterocyclyl."

In the present invention, the term "heterocyclyl group containing oxygen" refers to a 3- to 14-membered heterocyclyl, preferably 4- to 10-membered heterocyclyl, more preferably 5- to 6-membered heterocyclyl, in which at least one carbon atom of the ring is replaced by an O atom. Examples thereof include, but are not limited to, furyl, pyranyl, tetrahydrofuryl, tetrahydropyranyl, dibenzopyranyl and the like. Unless otherwise specified, in the present invention, a heterocyclyl group containing oxygen can be substituted or unsubstituted. The substituents are such as those as described above for "heterocyclyl."

In the present invention, the term "alkylamino" refers to an amino group in which at least one H atom is replaced by an alkyl, which includes monoalkylamino or dialkylamino. Examples thereof include, but are not limited to, —NH(C$_1$-$_8$alkyl) and —N(C$_{1-8}$alkyl)$_2$.

In the present invention, the term "alkylthio" refers to —S-alkyl, for example, —S—C$_{1-8}$alkyl.

I. Polyimide Precursor Composition

1. Amic Acid Ester Oligomer of Formula (1)

The polyimide precursor composition according to the present invention comprises an amic acid ester oligomer of Formula (1):

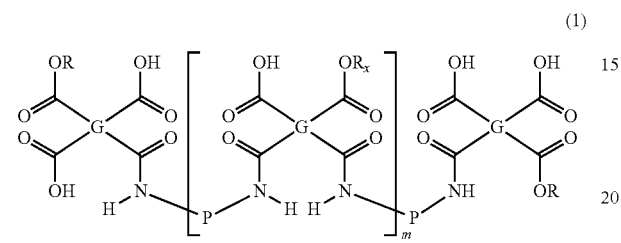
(1)

wherein:
G is each independently a tetravalent organic group;
P is each independently a divalent organic group;
R is each independently C$_1$-C$_{14}$ alkyl, C$_6$-C$_{14}$ aryl unsubstituted or substituted with one or more groups selected from hydroxyl and C$_1$-C$_4$ alkyl, or a group having an ethylenically unsaturated bond;
R$_x$ is each independently H, C$_1$-C$_8$ alkyl, or an ethylenically unsaturated group; m is an integer from 1 to 100, preferably an integer from 2 to 25, and more preferably an integer from 4 to 15. If m is too large, the resulting amic acid ester oligomer has a too large molecular weight, and has the disadvantages of a high viscosity that is adverse to the coating process and a poor solubility that is adverse to the development process.

The C$_1$-C$_{14}$ alkyl may be linear or branched, and is preferably methyl, ethyl, n-propyl, iso-propyl, 1-methylpropyl, 2-methylpropyl (i.e., iso-butyl), n-butyl, t-butyl, 1-methylbutyl, 2-methylbutyl, pentyl, hexyl, heptyl, or octyl.

The group having an ethylenically unsaturated bond refers to a group having at least one C=C bond, which can be crosslinked upon irradiation. Therefore, when R$_x$ in the structure of the oligomer is a group having an ethylenically unsaturated bond, the oligomer is allowed to have photosensitivity. The group having an ethylenically unsaturated bond is preferably selected from the group consisting of ethenyl, propenyl, methylpropenyl, n-butenyl, iso-butenyl, ethenylphenyl, propenylphenyl, propenyloxymethyl, propenyloxyethyl, propenyloxypropyl, propenyloxybutyl, propenyloxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, and a group of Formula (2):

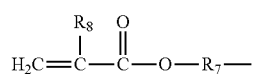
(2)

where R$_7$ is phenylene, C$_1$-C$_8$ alkylene, C$_2$-C$_8$ alkenylene, C$_3$-C$_8$ cycloalkylene, C$_1$-C$_8$ hydroxyalkylene, or

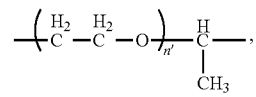

in which n' is an integer from 1 to 4, and R$_8$ is hydrogen or C$_1$-C$_4$ alkyl.

According to a preferred embodiment of the present invention, R is selected from:

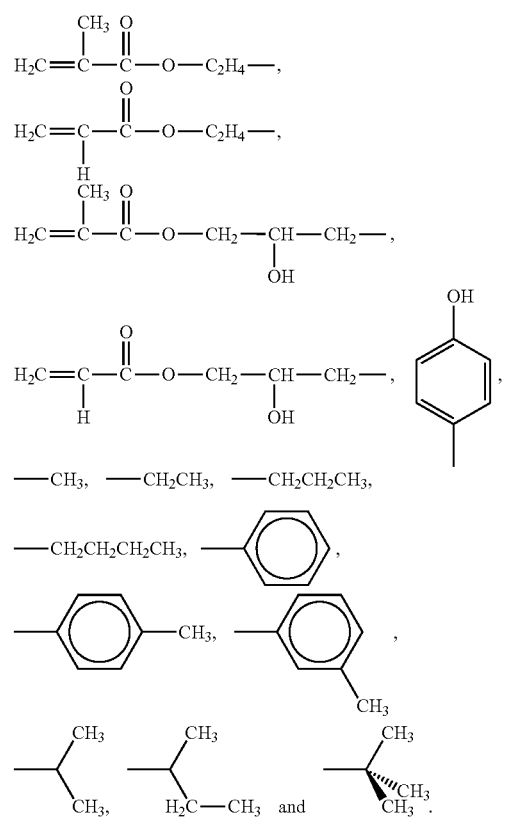

According to a preferred embodiment of the present invention, the group R$_x$ is preferably each independently H, methyl, ethyl, propyl, butyl, 2-hydroxypropyl methacrylate, ethyl methacrylate, ethyl acrylate, propenyl, methylpropenyl, n-butenyl, or iso-butenyl. More preferably, R$_x$ is each independently H or a group of

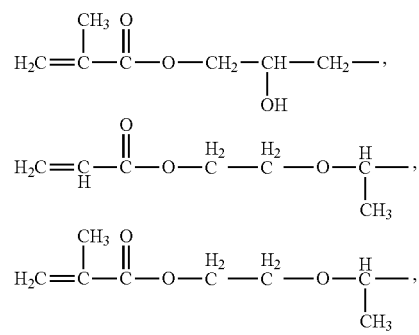

-continued

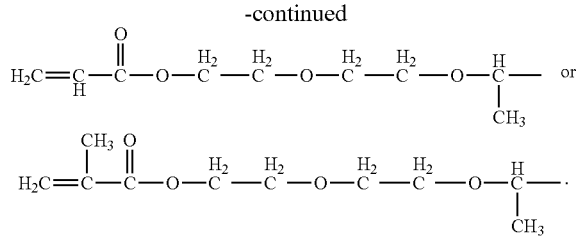

In the present invention, the tetravalent organic group G can be a tetravalent aromatic group, a tetravalent cycloalkyl group, a tetravalent heterocyclyl group or an analogue thereof. Preferably, G is each independently:

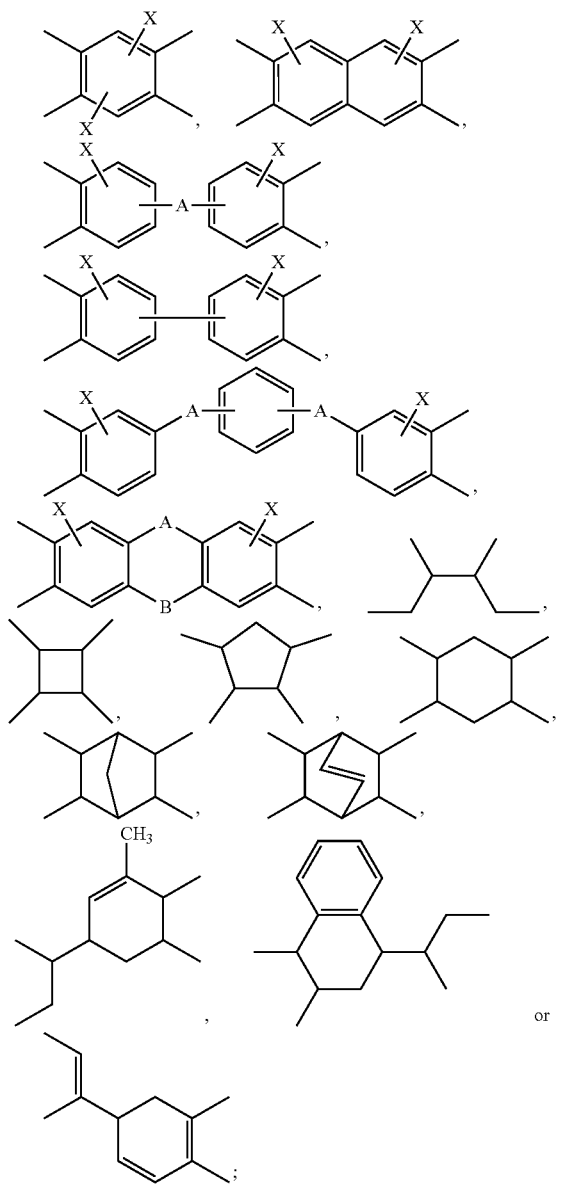

wherein X is each independently hydrogen, halo, $C_1$-$C_4$ perfluoroalkyl, or $C_1$-$C_4$ alkyl; and A and B at each occurrence are each independently a covalent bond, $C_1$-$C_4$ alkylene unsubstituted or substituted with one or more groups selected from hydroxyl and $C_1$-$C_4$ alkyl, $C_1$-$C_4$ perfluoroalkylene, $C_1$-$C_4$ alkyleneoxy, silylene, —O—, —S—, —C(O)—, —OC(O)—, —S(O)$_2$—, —C(=O)O—($C_1$-$C_4$ alkylene)-OC(=O)—, —CONH—, phenyl, biphenylyl, or

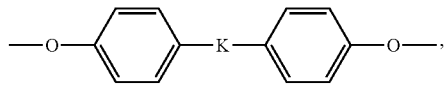

wherein K is —O—, —S(O)$_2$—, $C_1$-$C_4$ alkylene (such as methylene, ethylene or —C(CH$_3$)$_2$—) or $C_1$-$C_4$ perfluoroalkylene (such as perfluoromethylene, perfluoroethylene or —C(CF$_3$)$_2$—).

Preferably, the tetravalent organic group G is each independently:

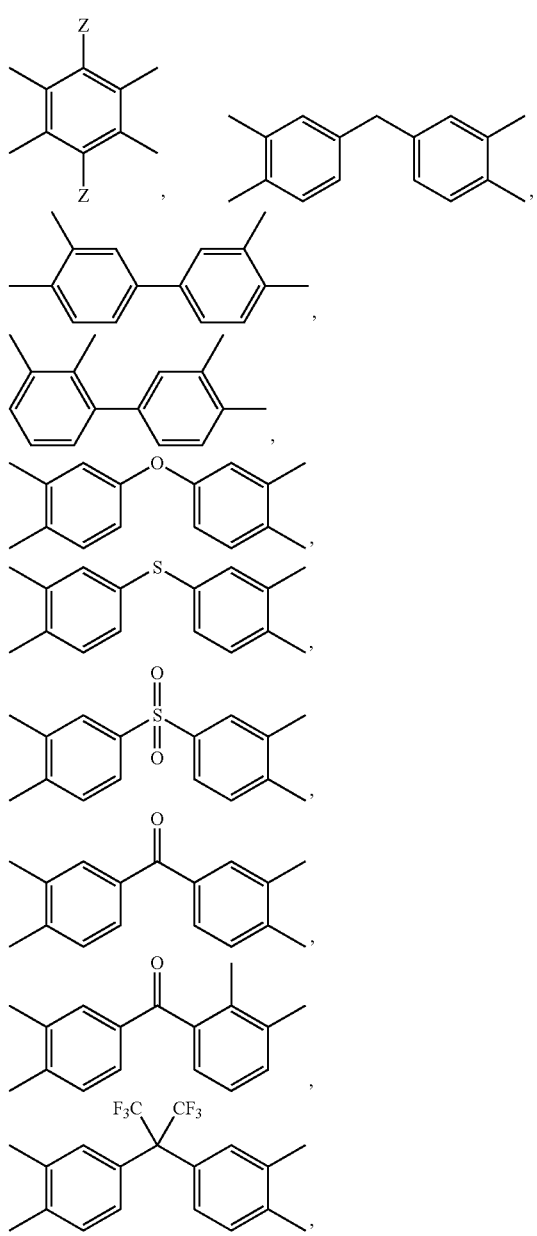

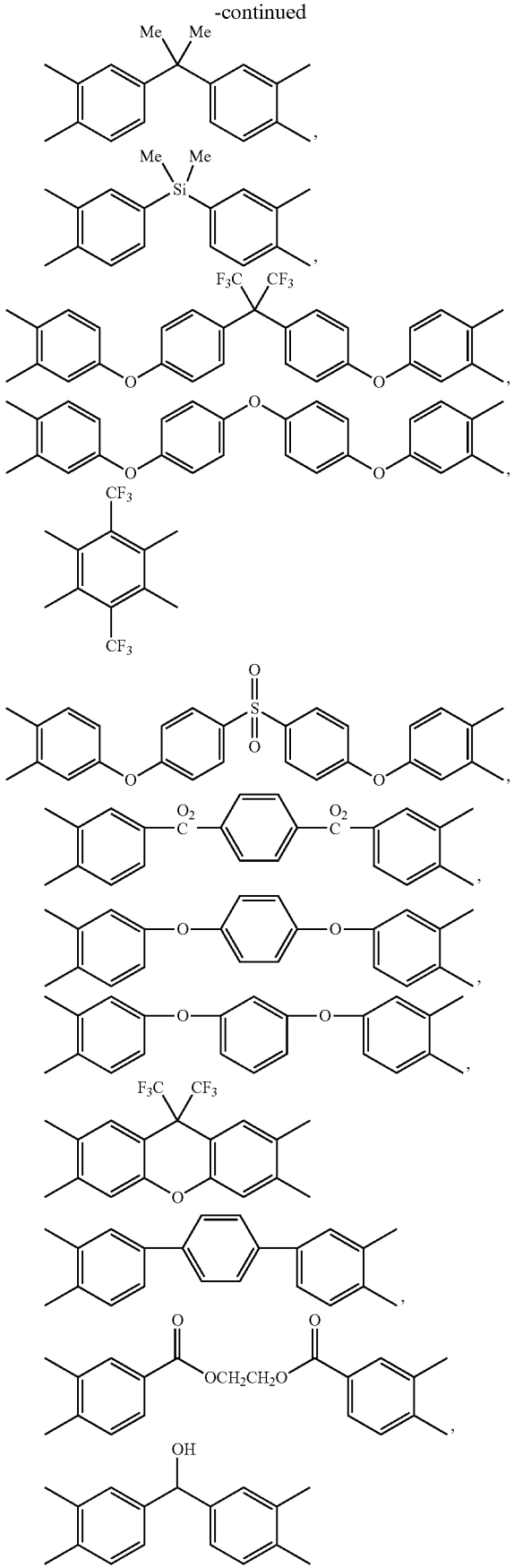
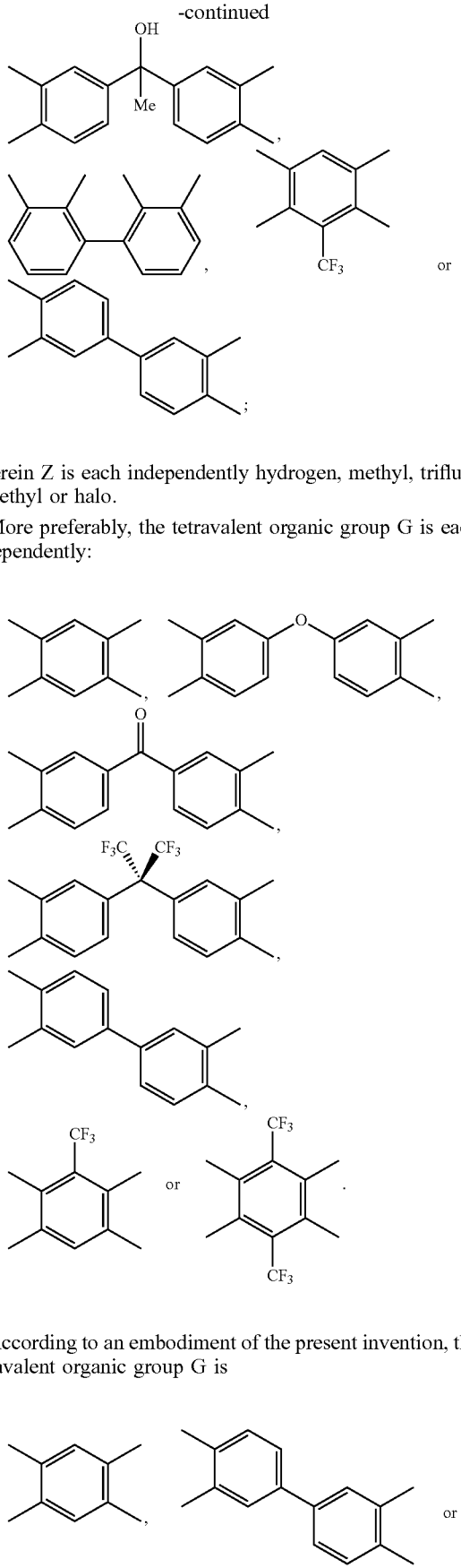
wherein Z is each independently hydrogen, methyl, trifluoromethyl or halo.
More preferably, the tetravalent organic group G is each independently:
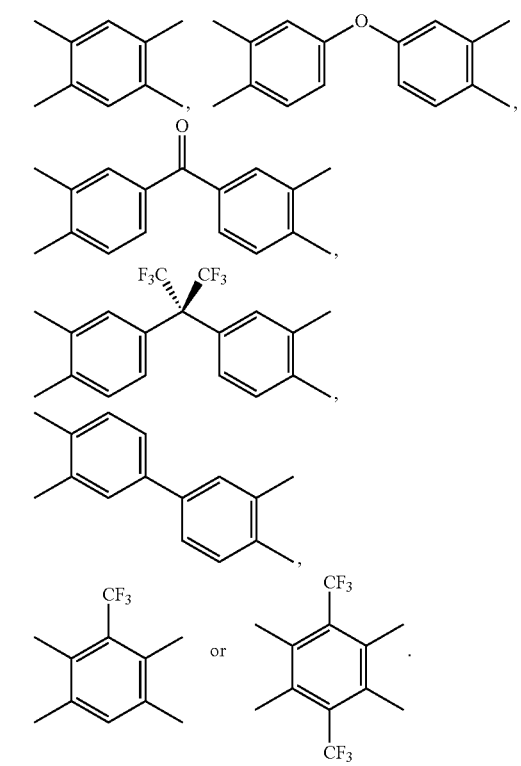
According to an embodiment of the present invention, the tetravalent organic group G is
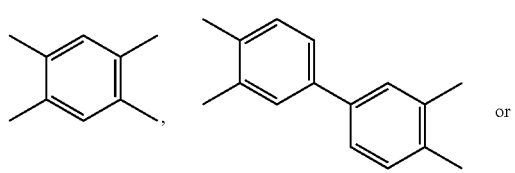

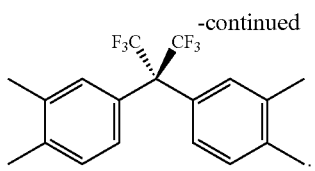

In the present invention, the divalent organic group P is not particularly limited. In general, the divalent organic group P can each independently be a divalent aromatic group, a divalent heterocyclyl group or a divalent group containing siloxane, which is for example but not limited to:

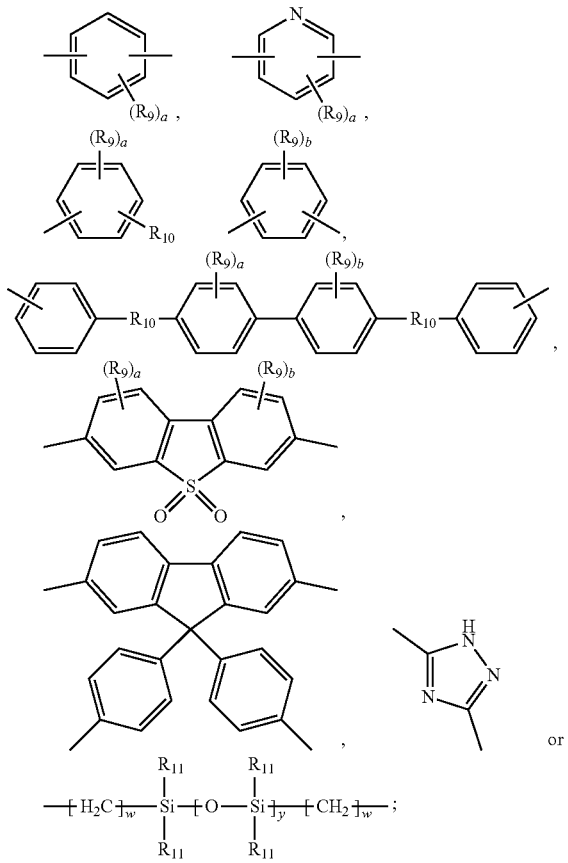

wherein:
$R_9$ is each independently H, $C_1$-$C_4$ alkyl, $C_1$-$C_4$ perfluoroalkyl, $C_1$-$C_4$ alkoxy, halo, —OH, —COOH, —NH$_2$ or —SH;
a is each independently an integer from 0 to 4;
b is each independently an integer from 0 to 4; and
$R_{10}$ is a covalent bond or a group selected from the group consisting of:

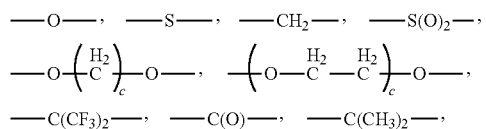

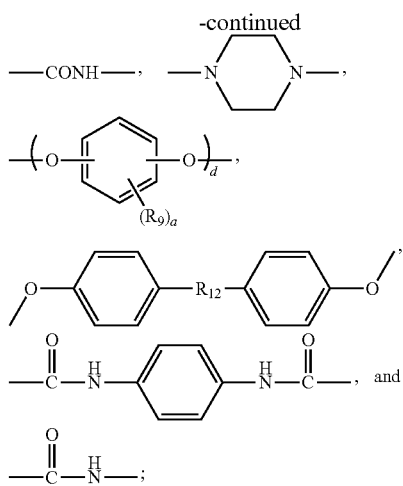

wherein
c and d are each independently an integer from 1 to 20; $R_{12}$ is —S(O)$_2$—, —C(O)—, a covalent group, $C_1$-$C_4$ alkyl or $C_1$-$C_4$ perfluoroalkyl; $R_9$ and a are as defined above;
$R_{11}$ is each independently hydrogen, halo, phenyl, $C_1$-$C_4$ alkyl, or $C_1$-$C_4$ perfluoroalkyl; and
w and y are each an integer from 1 to 3.

Preferably, the divalent organic group P is each independently:

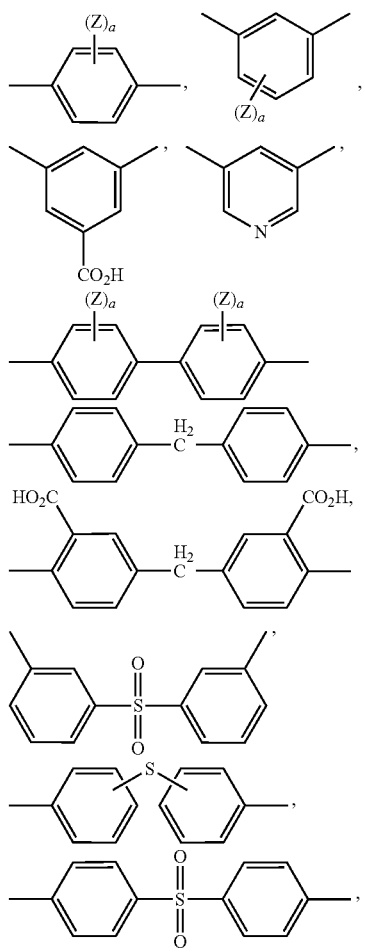

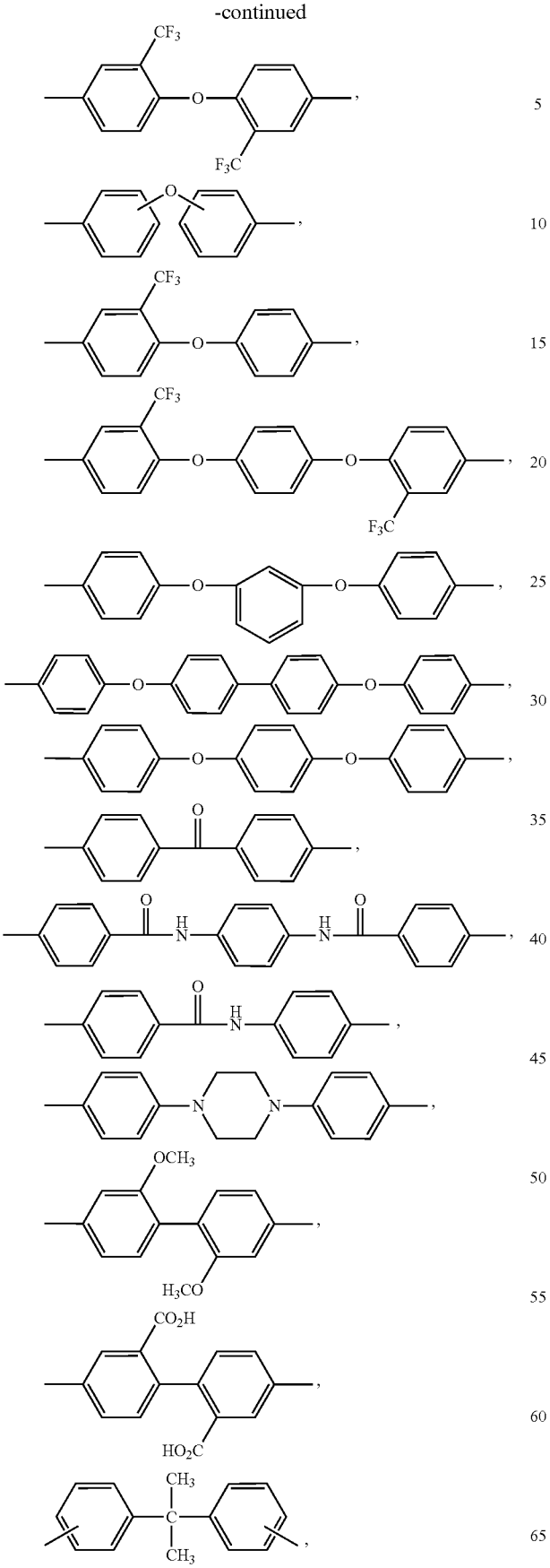
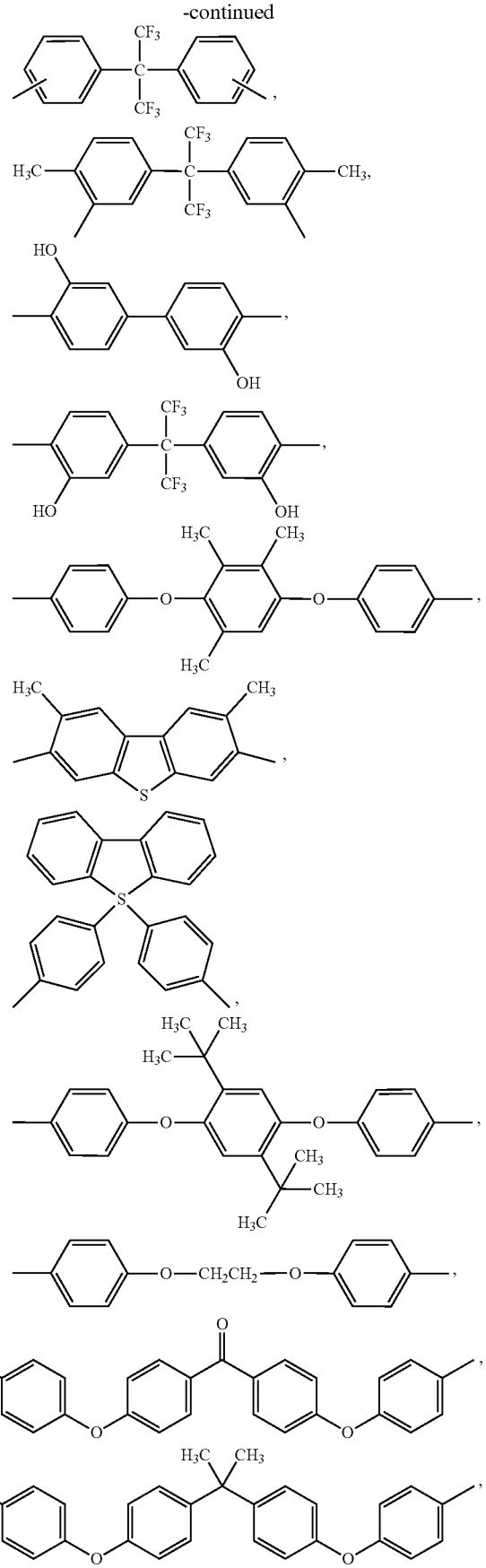

-continued

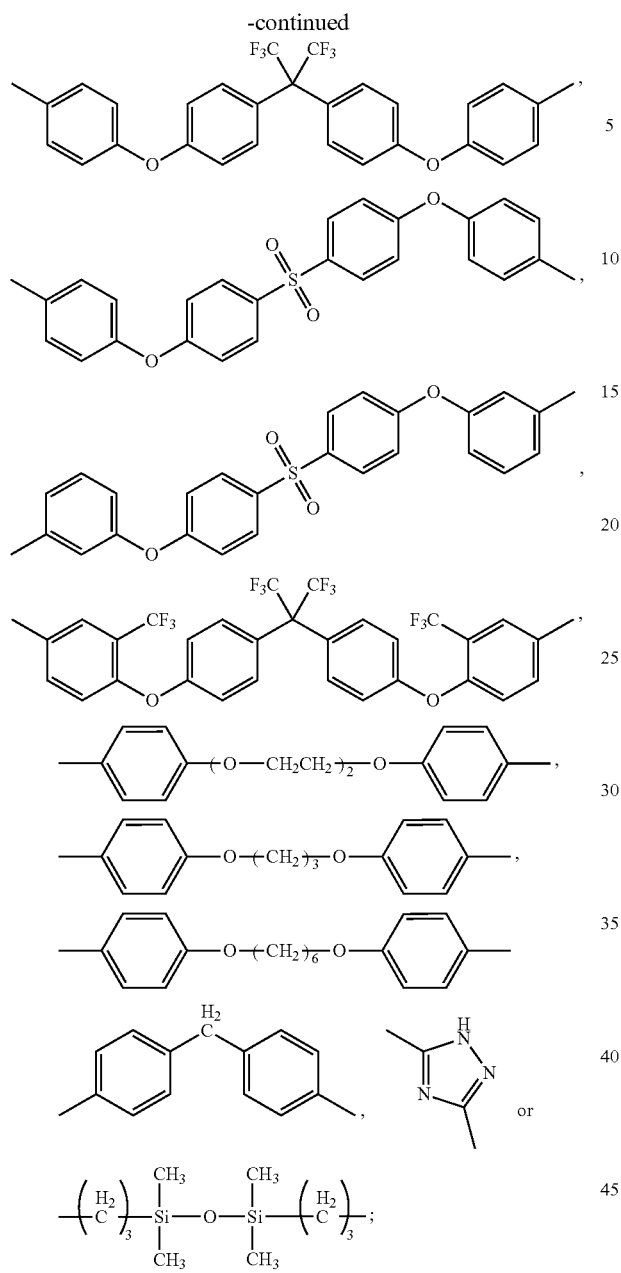

wherein:

a is each independently an integer from 0 to 4; and

Z is each independently hydrogen, methyl, trifluoromethyl or halo.

More preferably, the divalent organic group P is each independently:

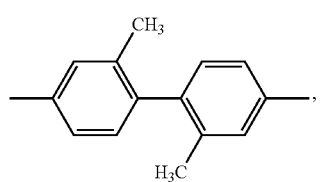

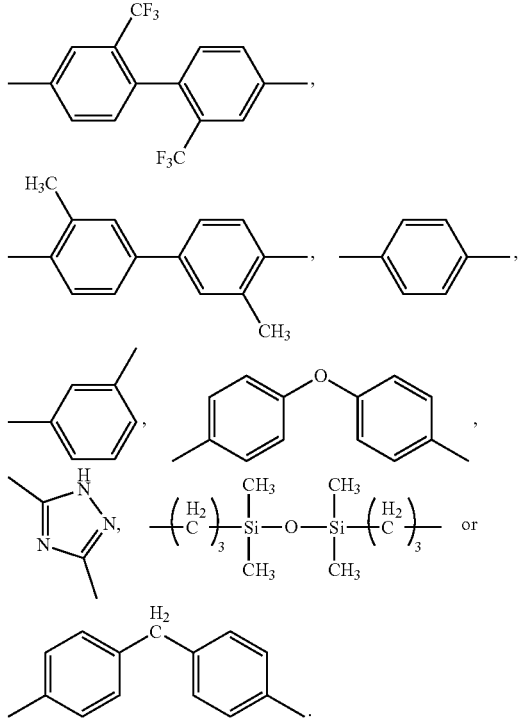

In an embodiment of the present invention, the above-mentioned divalent organic group P is

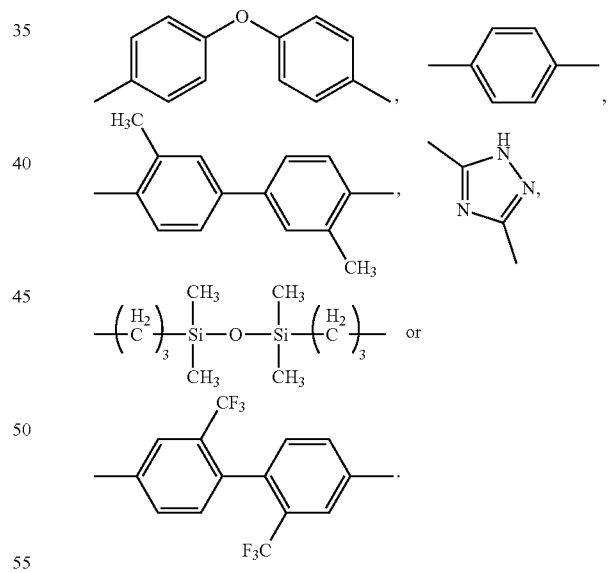

The method for preparing the amic acid ester oligomer of Formula (1) is as described in Taiwan Invention Patent Application No. 095138481, which is incorporated herein by reference in its entirety.

Compared with the polyimide precursor in the prior art, the amic acid ester oligomer of Formula (1) used in the present invention has relatively fewer acid groups, and thus increased hydrophobicity and reduced hydrolysis rate, so it exhibits a good storage stability and can be stored at room temperature for later use, with no need of storage at a low temperature (e.g. −20° C.).

2. Diamine of Formula (2) or (3)

Besides the amic acid ester oligomer of Formula (1), the polyimide precursor composition of the present invention further comprises a diamine of Formula (2) or (3):

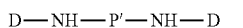 (2)

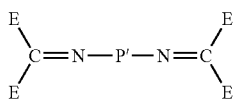 (3)

wherein:

P' is each independently a divalent organic group as defined above for the divalent organic group P;

D is each independently $C_1$-$C_8$ alkyl unsubstituted or substituted with one or more groups selected from $C_6$-$C_{14}$ aryl and a heterocyclyl group containing nitrogen; $C_1$-$C_8$ haloalkyl; a 5- or 6-membered heterocyclyl group containing oxygen unsubstituted or substituted with one or more groups selected from $C_1$-$C_8$ alkyl and $C_1$-$C_8$ hydroxyalkyl; a heterocyclyl group containing nitrogen unsubstituted or substituted with one or more groups selected from oxo, $C_1$-$C_8$ alkyl, and —$NO_2$;

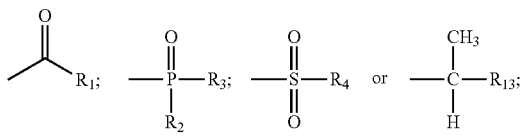

$R_1$ is H; $C_6$-$C_{14}$ aryl unsubstituted or substituted with one or more groups selected from $C_1$-$C_8$ alkyl and $C_1$-$C_8$ haloalkyl; a heterocyclyl group containing nitrogen; $C_4$-$C_{10}$ cycloalkyl; $C_1$-$C_8$ alkyl or $C_1$-$C_8$ alkoxy unsubstituted or substituted with one or more groups selected from $C_6$-$C_{14}$ aryl, a heterocyclyl group containing nitrogen. —S—$R_4$,

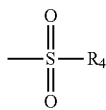

and —CN; $C_1$-$C_8$ haloalkyl; $C_1$-$C_8$ haloalkoxy; or —$NR_5R_6$;

$R_{13}$ is

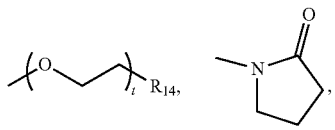

—$OR_{15}$ or $C_1$-$C_{10}$ alkoxy;

$R_2$, $R_3$, $R_4$, $R_5$ and $R_6$ may be the same or different and are each independently H; $C_1$-$C_8$ alkyl or $C_1$-$C_8$ alkoxy unsubstituted or substituted with one or more $C_6$-$C_{14}$ aryl; $C_6$-$C_{14}$ aryl or $C_6$-$C_{14}$ aryloxy unsubstituted or substituted with one or more groups selected from $C_1$-$C_8$ alkyl and —$NO_2$; halo; $C_1$-$C_8$ haloalkyl; or a heterocyclyl group containing nitrogen;

$R_{14}$ is (meth)acryloyloxy;

$R_{15}$ is a $C_4$-$C_{10}$ cycloalkyl or a heterocyclyl group containing oxygen;

t is an integer from 1 to 20, preferably an integer from 1 to 10, and more preferably an integer from 1 to 5;

E is each independently H, $C_1$-$C_{14}$ alkyl, alkylamino, alkylthio, $C_4$-$C_{10}$ cycloalkyl, a heterocyclyl group containing nitrogen, or

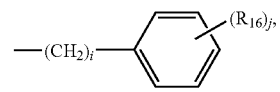

with the provision that two E attached to the same carbon atom are not H at the same time;

or alternatively, two E attached to the same carbon atom form, together with the carbon atom, a $C_6$-$C_{14}$ aryl group or a heterocyclyl group;

$R_{16}$ is each independently halo, hydroxyl, $C_1$-$C_8$ alkoxy, $C_1$-$C_8$ haloalkyl, or —$NO_2$.

i is 0, 1, 2 or 3; and j is 0, 1, 2 or 3.

According to an embodiment of the present invention, the substituent D contained in the diamine of Formula (2) is (i) $C_1$-$C_8$ alkyl unsubstituted or substituted with one or more groups selected from $C_6$-$C_{14}$ aryl and a 5- or 6-membered heterocyclyl group containing nitrogen; $C_1$-$C_8$ haloalkyl; a 5- or 6-membered heterocyclyl group containing oxygen unsubstituted or substituted with one or more groups selected from $C_1$-$C_8$ alkyl and $C_1$-$C_8$ hydroxyalkyl; or a 5- or 6-membered heterocyclyl group containing nitrogen substituted with one or more groups selected from $C_1$-$C_8$ alkyl, oxo and —$NO_2$.

According to an embodiment of the present invention, the substituent D contained in the diamine of Formula (2) is

 (ii)

wherein $R_1$ is pyrrolyl, imidazolyl, pyrazolyl, pyrimidinyl, pyridinyl, H, $C_1$-$C_8$ alkyl (e.g. methyl, ethyl, n-propyl, iso-propyl, n-butyl, iso-butyl, t-butyl, pentyl or hexyl), $C_1$-$C_8$ haloalkyl (e.g. trifluoromethyl or pentafluoroethyl), $C_6$-$C_{14}$ aryl (e.g. phenyl), $C_1$-$C_8$ alkoxy (e.g. methoxy, ethoxy, propoxy, butoxy, pentyloxy, hexyloxy or heptyloxy), $C_1$-$C_8$ haloalkoxy (e.g. perfluoromethyloxy, perfluoroethyloxy, $C_6$-$C_{14}$ aryl-$C_1$-$C_8$ alkoxy (e.g. benzyloxy or fluorenylmethyloxy), —$NH(C_6$-$C_{14}$ aryl) (e.g. —NHPh), —$NH(C_1$-$C_8$ alkyl) (e.g. —$NHCH_3$), or the following groups:

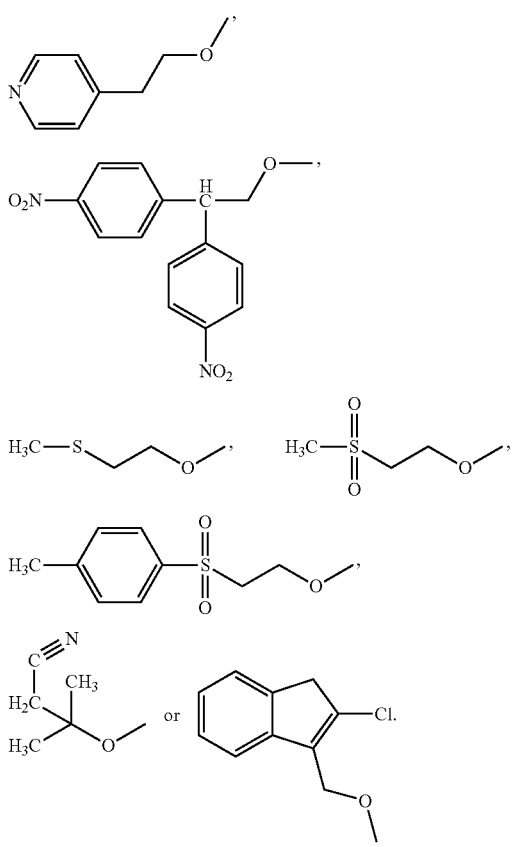

According to an embodiment of the present invention, the substituent D contained in the diamine of Formula (2) is

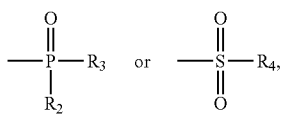

$C_1$-$C_8$ haloalkyl (e.g. —$CF_3$),

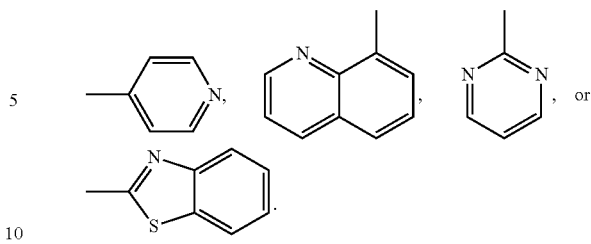

According to an embodiment of the present invention, the substituent D contained in the diamine of Formula (2) is

wherein $R_{13}$ is

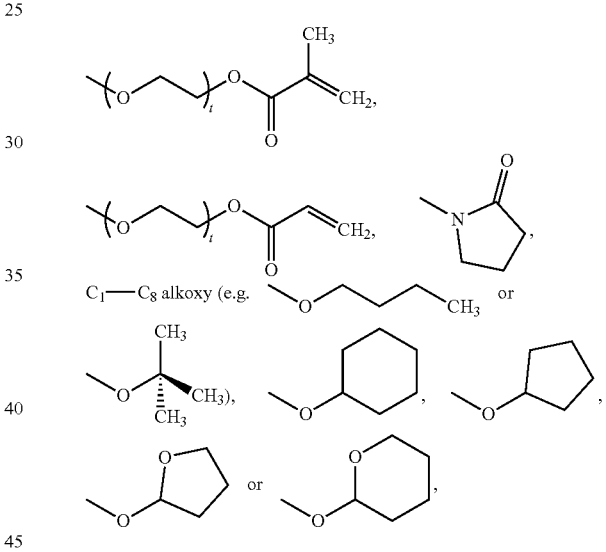

and t is an integer from 1 to 5.

According to a preferred embodiment of the present invention, the substituent D contained in the diamine of Formula (2) is methyl, ethyl, propyl, butyl, or selected from the following groups:

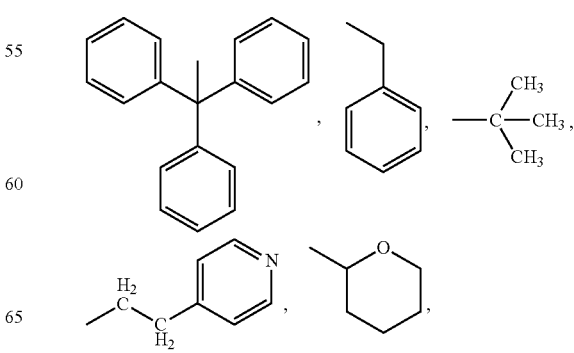

-continued

-continued

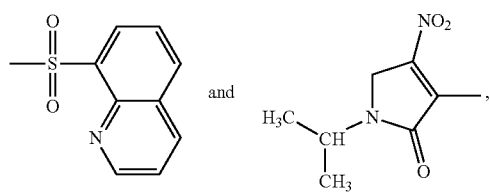

wherein t is an integer from 1 to 5.

According to an embodiment of the present invention, the substituent E contained in the diamine of Formula (3) may be the same or different and is each independently H, phenyl,

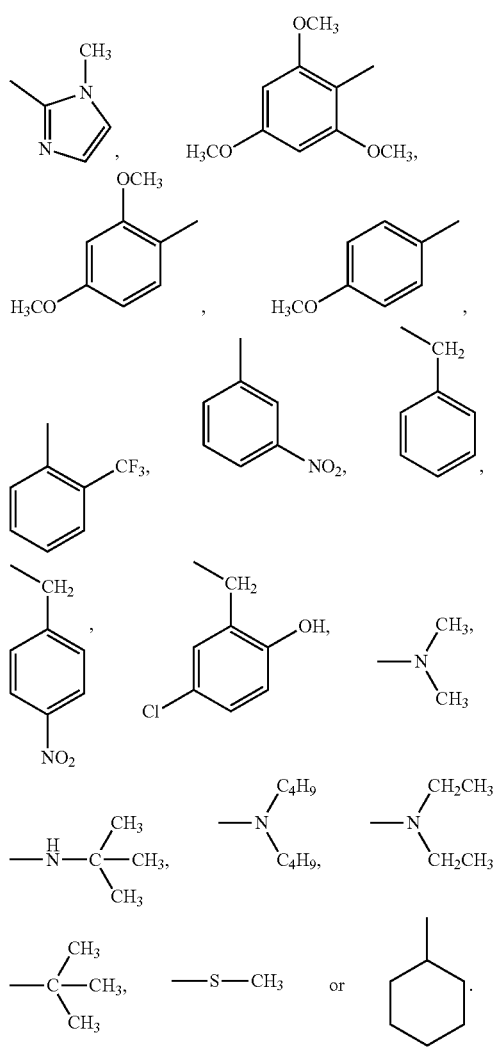

According to another embodiment of the present invention, two E attached to the same carbon atom form, together with the carbon atom, a $C_6$-$C_{14}$ aryl group or a heterocyclyl group containing oxygen, sulfur, or nitrogen atom. In a preferred embodiment of the present invention, two E attached to the same carbon atom form, together with the carbon atom, a $C_6$-$C_{14}$ aryl group or a heterocyclyl group containing oxygen, sulfur, or nitrogen atom such that the moiety

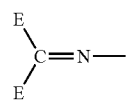

in Formula (3) has a structure of:

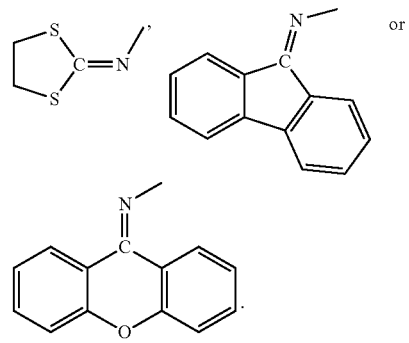

The diamine of Formula (2) or (3) can be prepared by reacting a compound bearing the group D or E with a diamine compound of Formula (4):

$$H_2N-P'-NH_2 \qquad (4)$$

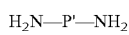

where P' is as defined above.

In the present invention, the diamine compound of Formula (4) is not particularly limited and an aromatic diamine is usually used. The aromatic diamines useful in the present invention are well known to persons having ordinary skill in the art. For example, the aromatic diamine can be selected from, but is not limited to, the following group: 4,4'-oxydianiline (ODA), para-phenylenediamine (pPDA), 2,2-dimethyl-4,4-diamino-biphenyl (DMDB), 2,2'-bis(trifluoromethyl) benzidine (TFMB), o-tolidine (oTLD), 4,4'-octafluorobenzidine (OFB), tetrafluorophenylenediamine (TFPD), 2,2',5,5'-tetrachlorobenzidine (TCB), 3,3'-dichlorobenzidine (DCB), 2,2'-bis(3-aminophenyl)hexafluoropropane, 2,2'-bis(4-aminophenyl)hexafluoropropane, 4,4'-oxobis(3-trifluoromethyl)aniline, 3,5-diaminobenzotrifluoride, tetrafluorophenylene diamine, tetrafluoro-m-phenylene diamine, 1,4-bis(4-aminophenoxy-2-tert-butylbenzene (BATB), 2,2'-dimethyl-4,4'-bis(4-aminophenoxy)biphenyl (DBAPB), 2,2-bis[4-(4-aminophenoxy)phenyl]hexafluoropropane (BAPPH), 2,2'-bis[4-(4-aminophenoxy)phenyl]norborane (BAPN), 5-amino-1-(4'-aminophenyl)-1,3,3-trimethylindane, 6-amino-1-(4'-aminophenyl)-1,3,3-trimethylindane, 4,4'-methylenebis(o-chloroaniline), 3,3'-dichlorobenzidine, 3,3'-sulfonyldianiline, 4,4'-diaminobenzophenone, 1,5-diaminonaphthalene, bis(4-aminophenyl)diethyl silane, bis(4-aminophenyl)diphenyl silane, bis(4-aminophenyl)ethyl phosphine oxide, N-(bis(4-aminophenyl))-N-methyl amine, N-(bis(4-aminophenyl))-N-phenyl amine, 4,4'-methylenebis(2-methylaniline), 4,4'-methylenebis(2-methoxyaniline), 5,5'-methylenebis(2-aminophenol), 4,4'-oxybis(2-methoxyaniline), 4,4'-oxybis(2-chloroaniline), 2,2'-bis(4-aminophenol), 5,5'-oxybis(2-aminophenol), 4,4'-thiobis(2-methylaniline), 4,4'-thiobis(2-methoxyaniline), 4,4'-thiobis(2-chloroaniline), 4,4'-sulfonylbis(2-methylaniline), 4,4'-sulfonylbis(2-ethoxyaniline), 4,4'-sulfonylbis(2-chloroaniline), 5,5'-sulfonylbis(2-aminophenol), 3,3'-dimethyl-4,4'-diaminobenzophenone, 3,3'-dimethoxy-4,4'-diaminobenzophenone, 3,3'-dichloro-4,4'- diaminobenzophenone, 4,4'-diaminobiphenyl, m-phenylenediamine, 4,4'-methylenedianiline (MDA), 4,4'-thiodianiline, 4,4'-sulfonyldianiline, 4,4'-isopropylidenedianiline, 3,3'-dimethoxybenzidine, 3,3'-dicarboxybenzidine, 2,4-tolyl-diamine, 2,5-tolyl-diamine, 2,6-tolyl-diamine, m-xylyldiamine, 2,4-diamino-5-chloro-toluene, 2,4-diamino-6-chloro-toluene, and a mixture thereof. Preferably, the aromatic diamine is 4,4'-oxy-dianiline (ODA), para-phenylenediamine (pPDA), 2,2-dimethyl-4,4-diamino-biphenyl (DMDB), 2,2'-bis(trifluoromethyl)benzidine (TFMB), o-tolidine (oTLD), 4,4'-methylenedianiline (MDA), 3,5-diamino-1,2,4-triazole or a mixture thereof.

Preferably, the diamine compound of Formula (4) is selected from the group consisting of:

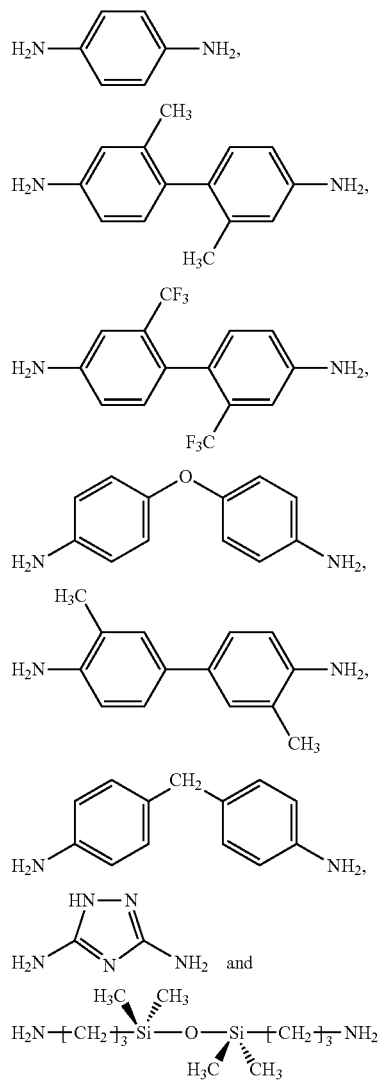

and

The compound bearing the group D or E used in the present invention may be any compound bearing the above-mentioned group D or E and capable of reacting with the terminal amino group of the diamine compound of Formula (4), which for example, but is not limited to, acetic anhydride, trifluoroacetic acid anhydride (TFAA), benzaldehyde, tert-butyl chloride,

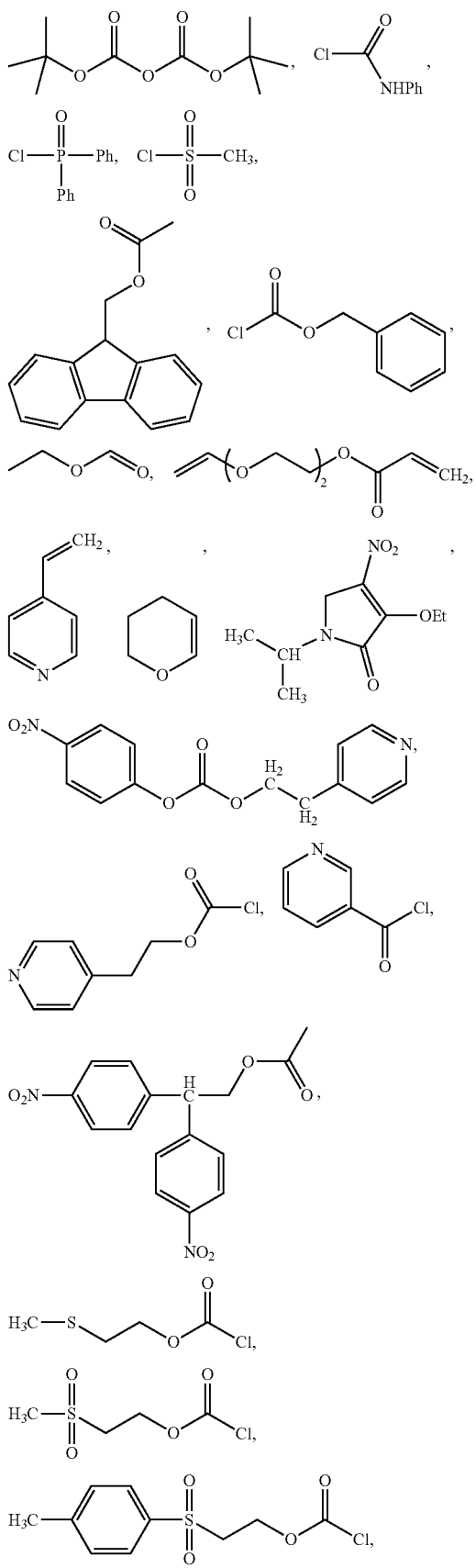

-continued

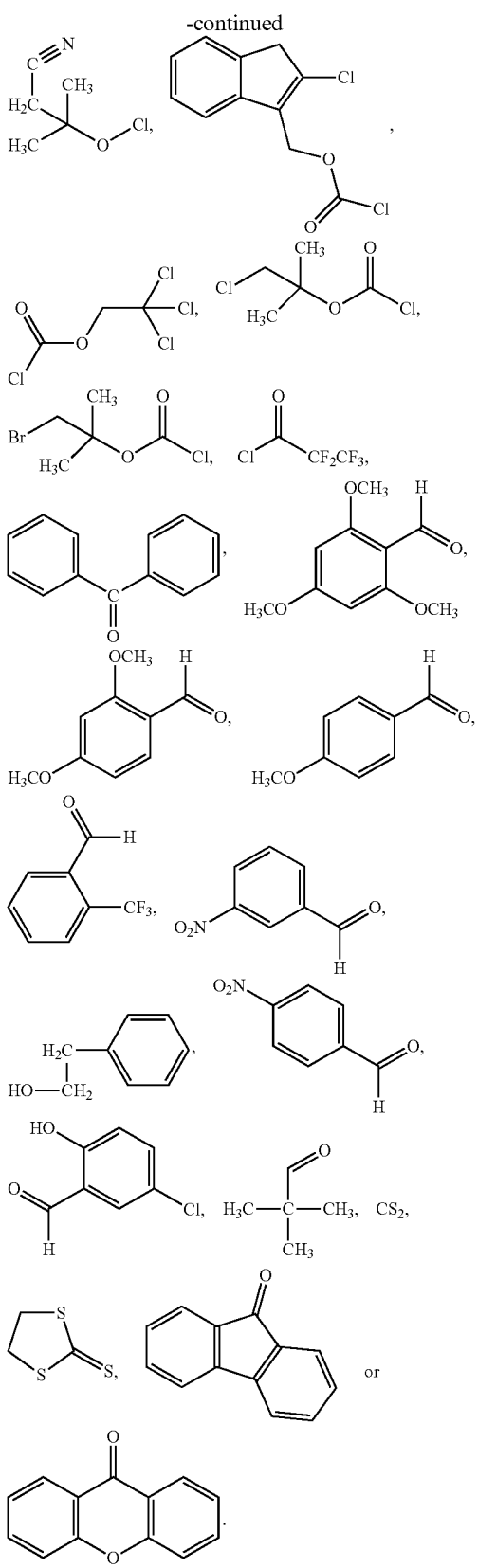

The compound bearing the group D or E reacts with the terminal amino group of the diamine compound of Formula (4) for replacement, so as to form a terminal group that is stable at room temperature and does not react with an amic acid ester oligomer or a dehydrating agent.

In the case that trifluoroacetic acid anhydride is used, the reaction scheme is as follows:

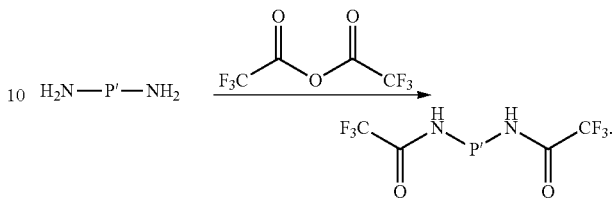

In the case that

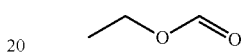

is used, the reaction scheme is as follows:

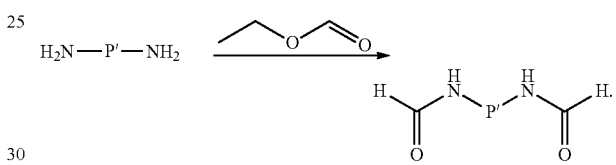

In the case that benzaldehyde is used, the reaction scheme is as follows:

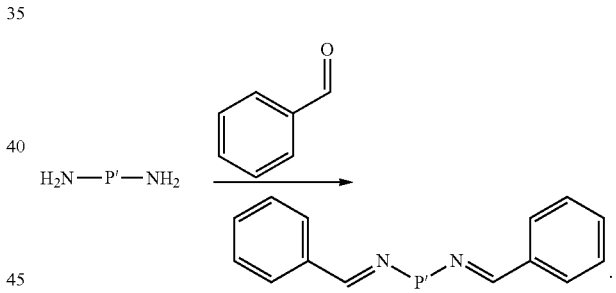

In the case that

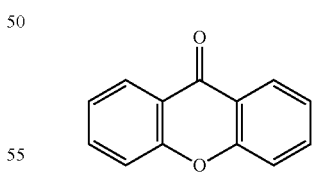

is used, the reaction scheme is as follows:

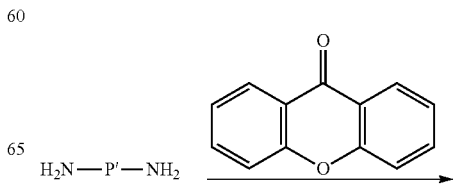

-continued

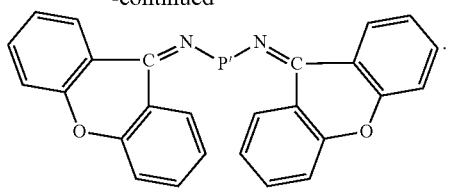

In the polyimide precursor composition of the present invention, the ratio of the total molar number of the amic acid ester oligomer of Formula (1) to the total molar number of the diamine of Formula (2) or (3) is preferably 0.9:1 to 1.1:1.

When the diamine compound of Formula (4) is used in the polyimide precursor composition, because the nitrogen atom on the amino group contains a lone electron pair, the diamine compound of Formula (4) is prone to act as a nucleophilic reagent. If a chemical imidization process is directly employed, the diamine compound of Formula (4) would react with a carbon atom carrying a partial positive charge, and thus it would react with a dehydrating agent (such as acetic anhydride) to be acylated, etc, causing that the diamine compound cannot be further polymerized with the amic acid ester oligomer into a polyimide of high molecular weight. Moreover, the diamine compound of Formula (4) is also prone to react with the backbone of the amic acid ester oligomer of Formula (1), causing the hydrolysis and the molecular weight change of the amic acid ester oligomer. Therefore, the storage stability is affected, resulting in a poor operability of the subsequent processes and poor physical properties of the finally prepared polyimide.

In the present invention, the terminal amino group of the diamine compound of Formula (4) is modified with the group D or E, to provide a temporary protection for preventing the diamine compound of Formula (4) from reaction with a dehydrating agent or the backbone of the amic acid ester oligomer of Formula (1). The diamine of Formula (2) or (3) obtained in the present invention has a low reactivity at room temperature or even at a higher temperature of 50 to 90° C., and thus will not react with the backbone of the amic acid ester oligomer, whereby the storage stability is enhanced. When the temperature is elevated (for example, from 90 to 170° C.), the group D or E is removed and —NH$_2$ is formed through reduction, that is, the diamine of Formula (4) is formed. The diamine of Formula (4) is then reacted with the amic acid ester oligomer of Formula (1) to form a larger polymer. In this way, a polyimide having excellent thermal, mechanical, and tensile properties is provided. Therefore, the polyimide precursor composition of the present invention is not only applicable to a thermal imidization process, but also more suitable for use with a chemical imidization process. Compared with the conventional thermal imidization process (which is generally continued for several hours at a high temperature of 300° C.), the hard baking temperature of the polyimide can be further reduced by using chemical imidization.

In addition, in another embodiment of the present invention, the group D or E can not only be removed by heating, but can also be removed based on the properties of the group D or E (for example, being easy to be removed in an acidic or alkaline environment) by adding a photoacid generator or a photobase generator to the composition. The photoacid generator or photobase generator can be decomposed upon irradiation with light to release an acidic or basic compound. Therefore, when the composition contains a photoacid generator or a photobase generator, an acidic or alkaline environment can be created by irradiation with light, thereby removing the corresponding group D or E. The type and amount of the photoacid generator or the photobase generator used are not particularly limited.

3. Solvent and Additives

The polyimide precursor composition according to the present invention further comprises a solvent, for facilitating the synthesis of the amic acid ester oligomer of Formula (1) or the diamine of Formula (2) or Formula (3) or increasing the leveling performance of the composition such that it is easy to coat the composition. The solvent may be any suitable solvent known to persons having ordinary skill in the art, and the amount thereof is not particularly limited.

Preferably, according to an embodiment of the present invention, the solvent is selected from the group consisting of dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol monomethyl ether, tetraethylene glycol dimethyl ether, methanol, ethanol, butanol, butylcellosolve, γ-butyrolactone, xylene, toluene, hexamethylphosphoramide, propylene glycol monomethyl ether acetate,

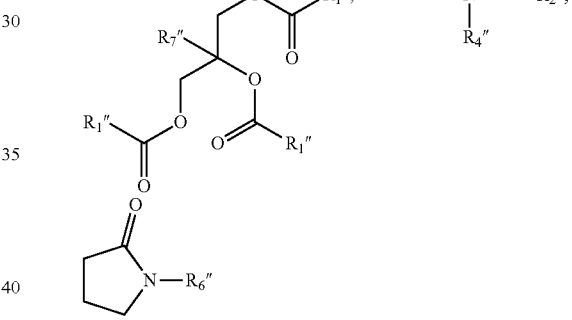

and a mixture thereof wherein:

$R_{1''}$ is each independently H, $C_1$-$C_{20}$ alkyl, $C_2$-$C_{20}$ alkenyl or $C_2$-$C_{20}$ alkynyl;

$R_{7''}$ is H or $C_1$-$C_3$ alkyl;

$R_{2''}$ is H, $C_1$-$C_{15}$ alkyl or $C_4$-$C_8$ cycloalkyl;

$R_{3''}$ and $R_{4''}$ are each independently $C_1$-$C_{10}$ alkyl, or $R_{3''}$ and $R_{4''}$ form, together with the nitrogen atom to which they are attached, a 5- to 6-membered heterocyclic ring; and $R_{6''}$ is $C_1$-$C_{15}$ alkyl, $C_2$-$C_{20}$ alkenyl or $C_4$-$C_8$ cycloalkyl.

Examples of solvents having the structure

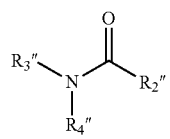

include, but are not limited to, N,N-dimethyl formamide, N,N-diethyl formamide, N,N-dimethylacetamide, N,N-diethyl acetamide or N,N-dimethyl capramide.

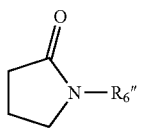

Examples of solvents having the structure include, but are not limited to, N-methyl-2-pyrrolidone, N-ethenyl-2-pyrrolidone, N-ethyl-2-pyrrolidone or N-octyl-2-pyrrolidone (NOP).

The polyimide precursor composition according to the present invention may comprise a photoinitiator when needed (for example, when used for a photosensitive coverlay or in other processes where a photosensitive polyimide is necessary). The photoinitiator generates a free radical under light irradiation and initiates a polymerization through the transfer of the free radical. There is no special limitation to the photoinitiator useful in the present invention. The photoinitiator suitable for the present invention may be, for example, selected from a group consisting of benzophenone, benzoin, 2-hydroxy-2-methyl-1-phenyl propanone, 2,2-dimethoxy-1,2-diphenylethan-1-one, 1-hydroxy-cyclohexyl-phenyl ketone, 2,4,6-trimethylbenzoyldiphenylphosphine oxide, oxime ester, and a combination thereof. The amount of the photoinitiator can be adjusted by persons having ordinary skill in the art through routine experiments. According to an embodiment of the present invention, the amount of the photoinitiator is in the range from 0.5 wt % to 5 wt % based on the total solids content of the composition.

The polyimide precursor composition according to the present invention may optionally comprise any additive known to persons having ordinary skill in the art for preparing polyimides, which, for example, but are not limited to, a pigment, a leveling agent, a defoamer agent, a coupling agent, a dehydrating agent, a thermal base generator, a photobase generator, a photoacid generator, an adhesion promotor, a catalyst, and a co-initiator. The amount of the additives can also be adjusted by persons having ordinary skill in the art through routine experiments.

The coupling agent useful in the present invention may selected from a group consisting of, without limitation, 3-aminopropyltrimethoxysilane (APrTMOS), 3-triaminopropyltriethoxysilane (APrTEOS), 3-aminophenyltrimethoxysilane (APTMOS), 3-aminophenyltriethoxysilane (APTEOS), and a combination thereof.

The thermal base generator useful in the present invention may selected from the following:

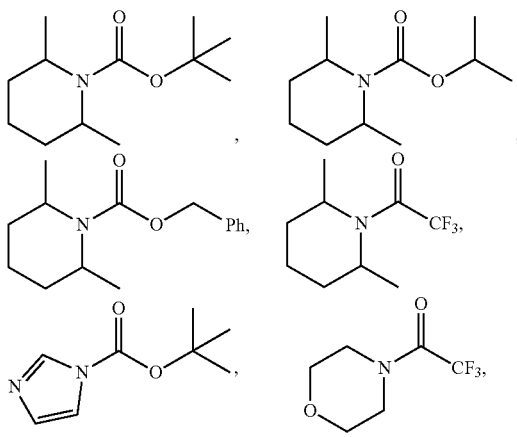

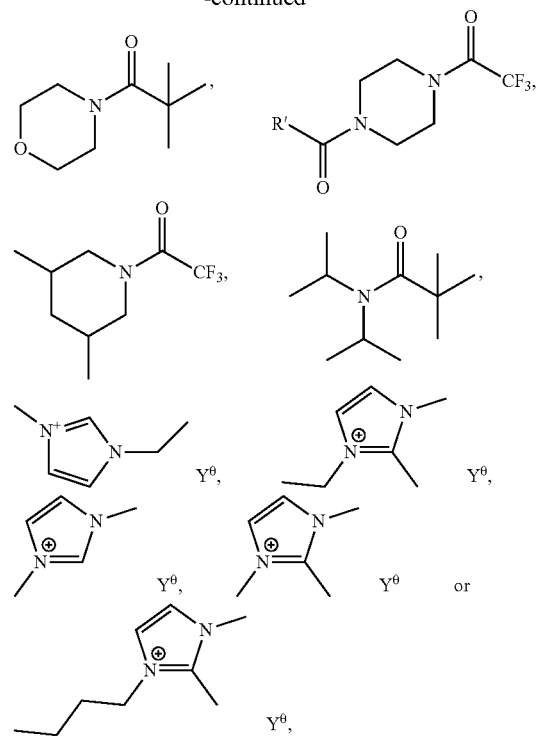

wherein $Y^\ominus$ is an anionic group.

The polyimide precursor composition of the present invention has a good storage stability. Due to the low molecular weight of the amic acid ester oligomer, the polyimide precursor composition of the present invention has a lower viscosity and exhibits a superior leveling property and operability during coating, compared with the prior art.

II. Dry Film Containing Polyimide Precursor Composition

The present invention further provides a dry film comprising the above-mentioned polyimide precursor composition.

The dry film of the present invention comprises a support carrier and a resin layer on the support carrier wherein the resin layer comprises the above-mentioned polyimide precursor composition.

The solvent content contained in the resin layer is at least 5 wt %, at least 6 wt %, at least 7 wt % or at least 10 wt %, preferably ranges from 15 to 60 wt %, more preferably ranges from 30 to 55 wt %, and particularly preferably ranges from 40 to 52 wt %, based on the total weight of the resin layer. In an embodiment of the present invention, when the solvent content is too low, a particular monomer may be caused to precipitate out, thus affecting the resolution after exposure (in the case where photosensitivity is concerned) and affecting the subsequent lamination process (unable to laminate). When the solvent content is too high, adhesive bleeding exists, affecting the uniformity in the film thickness, and causing the problem of surface stickiness. The type of the solvent is as describe above.

The support carrier can be any known to persons having ordinary skill in the art, such as a glass or plastic carrier. The plastic carrier is not particularly limited, which includes, for example, but is not limited to, polyester resins, such as polyethylene terephthalate (PET) and polyethylene naphthalate (PEN); polymethacrylate resins, such as polymethyl methacrylate (PMMA); polyimide resins; polystyrene resins; polycycloolefin resins; polyolefin resins; polycarbonate resins; polyurethane resins; triacetate cellulose (TAC); or a mixture thereof. The preferred carrier is polyethylene terephthalate, polymethyl methacrylate, polycycloolefin resin, or triacetate cellulose, or a mixture thereof. More preferably, the carrier is polyethylene terephthalate. The thickness of the carrier usually depends on the purpose of a desired electronic product and is preferably in the range from about 16 µm to about 250 µm.

According to an embodiment of the present invention, a surface of the support carrier that is laminated to the resin layer has an average surface roughness (Ra) of 0 to 5 µm. The average surface roughness can be determined at a central line of the surface to be measured using a 3D interferometer or an atomic force microscope.

The dry film of the present invention may be prepared by, for example, the following steps:
(1) preparing a polyimide precursor composition comprising the amic acid ester oligomer of Formula (1), a diamine of Formula (2) or Formula (3), and optionally a solvent or additive;
(2) coating the polyimide precursor composition obtained in the step (1) onto a support carrier, to form a dry film semi-product comprising the support carrier and a resin layer;
(3) transferring the dry film semi-product to a drying oven, drying by heating to remove the solvent, thereby adjusting the solvent content in the resin layer; and
(4) optionally, applying a protection film on the resin layer.

The solvent in the step (1) may be added during the preparation of the amic acid ester oligomer of Formula (1) or the diamine of Formula (2) or (3) to facilitate the synthesis of these compounds; or added after the preparation of these compounds, to adjust the operability of the polyimide precursor composition, such that it can be conveniently used in subsequent coating.

When the dry film is laminated to a substrate such as a flexible printed circuit board, air often remains between the resin layer of the dry film and the substrate to be laminated during the lamination process, and bubbles are left after lamination. The existence of the bubbles results in abnormal quality of the dry film, and affects the performances of the circuit board. Therefore, a vacuum lamination apparatus is generally used upon lamination to expel the air.

However, the vacuum lamination apparatus is expensive, by which the lamination operation can only be achieved in a sheet by sheet manner, and a roll-to-roll mode of production cannot be implemented. Therefore, in a preferred embodiment of the present invention, the solvent content in the dry film semi-product can be adjusted in the step (3) by controlling the heating time and temperature (e.g. heating and drying for 30 sec to 10 min at a suitable temperature ranging from 80 to 250° C.) such that the solvent is present in an amount of at least 5 wt %, at least 6 wt %, at least 7 wt % or at least 10 wt % (based on the total weight of the resin layer). Thus, the dry film has a bubble-dissolving effect and can be optionally pressurized with a high pressure (4-10 kgf/cm$^2$) after lamination to dissolve the air between the substrate and the dry film into the solvent in the dry film, so as to solve the problem of bubbles occurring to the dry film when laminated to a flexible printed circuit board, without using a vacuum lamination apparatus. Additionally, the dry film of the present invention has water absorbability, and has relatively stable properties in the presence of water, and thus is also applicable to a wet lamination process.

Moreover, the leveling property of the resin layer is affected by the glass transition temperature thereof. A higher glass transition temperature leads to a worse leveling property of the resin layer. In this case, the lamination is difficult and gas bubbles that are difficult to be dissolved may be produced during the lamination process. On the other hand, a lower glass transition temperature may cause the resin layer to be sticky during the lamination process, and thus the operability is poor. The solvent useful in the present invention also has the effect of adjusting the glass transition temperature of the resin layer. According to a preferred embodiment of the present invention, the resin layer of the present invention has a glass transition temperature in the range of −10° C. to 20° C., and preferably in the range of 0° C. to 15° C.

The protection film in step (4) includes, for example, but is not limited to polyester resins, for example, polyethylene terephthalate (PET) or polyethylene naphthalate (PEN); polymethacrylate resins, for example, polymethyl methacrylate (PMMA); polyimide resins; polystyrene resins; polycycloolefin resins; polyolefin resins; polycarbonate resins; polyurethane resins; triacetate cellulose (TAC); or a mixture thereof. Preferably, the protection film is polyethylene terephthalate, polymethyl methacrylate, polycycloolefin resins, triacetate cellulose or a mixture thereof. More preferably, the protection film is polyethylene terephthalate.

The dry film of the present invention may contain a non-photosensitive polyimide precursor composition or a photosensitive polyimide precursor composition (for example, by adding a group having an ethylenically unsaturated bond to the amic acid ester oligomer of Formula (1)), and thus is applicable to various uses and processes.

The dry film of the present invention is applicable to printed circuit boards or to a surface of a semiconductor package, and serves as a coverlay which is electrically insulated and can protect the circuits and achieve excellent advantages such as the prevention of circuit oxidation and solder short.

Moreover, the dry film containing the photosensitive polyimide precursor composition of the present invention has high resolution, high developing rate, electrolysis plating resistance, high temperature endurance, and high humidity endurance, etc. Therefore, the dry film of the present invention can also replace the coverlay currently used in the flexible printed circuit board or serves as an insulating material for semiconductors and active, passive and opto-electronic components.

III. Applications: Preparation of Matting Surface

The polymer film generally has surface gloss. It is known in the art that a matting agent (e.g., silica particles or polyimide particles) may be added to form a rough surface on the polyimide film. When the incident light is reflected by the rough surface, the fine rough structure on the surface allows the reflected light to diffusively scatter in different directions, and therefore, another visual appearance can be provided. Moreover, when the polyimide film is laminated to another substrate or film, the rough surface can enhance the wettability, thus enhancing the adhesion force. However, the addition of a large amount of matting agent particles may adversely affect the physicochemical properties of the polyimide film.

The present inventors have found that there is a difference in solubilities between the diamine of Formula (2) or (3) and the amic acid ester oligomer of Formula (1). When the solvent is removed by heating, the diamine of Formula (2) or (3) precipitates and forms a rough structure on the surface. Thus, the polyimide precursor composition of the present invention can achieve the preparation of a matting surface without using a matting agent.

Thus, in addition to the general applications or uses of polyimide, the polyimide precursor composition of the present invention is also applicable to the fabrication of a matting surface.

The present invention further provides a polyimide film or polyimide film laminate prepared with the polyimide precursor composition or the dry film of the present invention. More specifically, the present invention provides a polyimide film or polyimide film laminate having a matting surface that is prepared with the polyimide precursor composition or the dry film of the present invention.

In one aspect, the present invention provides a method of forming a polyimide laminate having a matting surface, comprising:
(1) laminating the dry film to a substrate in such a manner that the resin layer of the dry film faces the substrate;
(2) removing the support carrier from the dry film; and
(3) heating to remove the solvent.

In another aspect, the present invention provides a method of forming a polyimide laminate having a matting surface, comprising:
(1) applying the polyimide precursor composition of the present invention onto a substrate; and
(2) heating to remove the solvent.

1. Preparation of a Matting Surface with a Dry Film Containing a Non-Photosensitive Polyimide Precursor Composition According to one embodiment of the present invention, a polyimide film or polyimide film laminate having a matting surface can be prepared with a dry film containing a non-photosensitive polyimide precursor composition.

The polyimide film or polyimide film laminate having a matting surface may be prepared through a process comprising the following steps:
(1) providing a dry film containing a non-photosensitive polyimide precursor composition;
(2) removing an optional protection film, and then laminating the dry film to a substrate in such a manner that the resin layer of the dry film faces the substrate;
(3) removing a support carrier from the dry film; and
(4) heating to removing the solvent and imidizing the polyimide precursor composition, to form a polyimide.

The substrate may comprise a flexible circuit board, a wafer, a display or a touch panel or the like, or other optical or electronic components.

The lamination in the step (2) includes roller lamination, wet lamination, hot press, vacuum lamination or vacuum hot press.

Preferably, the step (2) may be performed in a roll-to-roll manner. A roll-to-roll operation, which is known to a person of ordinary skill in the art, refers to the steps of drawing out a sample from a rolled-up material, processing the sample, and winding the processed sample in a roller. For example, as shown in FIG. 1, a substrate A is drawn out from a roll of the substrate A, laminated with a dry film from a dry film roll 1 by using rollers 2 and 3, and then wound to form a product B. Therefore, the dry film of the present invention may be laminated to the substrate by a continuous process, which is favorable for simplifying the process and speeding up the process.

After the step (2) and prior to the step (3), a pressurized bubble-dissolving operation which is well known to persons having ordinary skill in the art can be optionally carried out. For example, the substrate on which the dry film has been applied is preferably wound into a roll and then the whole roll is delivered into an autoclave to dissolve the bubbles. The pressurization is preferably carried out at a temperature between 30° C. and 100° C. and a pressure between 2 atm and 10 atm for 10 to 60 minutes. Carrying out such pressurized bubble-dissolving operation is beneficial to rapidly dissolve undesired gas between the substrate and the resin layer into the resin layer, without using a vacuum lamination apparatus, and therefore, it achieves the effects of speeding up the process and saving the equipment cost.

The surface of the support carrier that is attached to the resin layer may have an average surface roughness of 0 to 5 µm, that is, the surface of the support substrate that is attached to the resin layer may be a smooth surface or a rough surface having an average surface roughness of not more than 5 µm. For the latter, when the support carrier is removed in the step (3), the rough surface structures can be transferred to the resin layer. However, since the resin layer has not yet cured and has some flowability at this time, the desired surface roughness may not be maintained.

A first object of the step (4) is to remove the solvent by heating. In this step, since the solubility of the diamine of Formula (2) or (3) is not as high as that of the amic acid ester oligomer of Formula (1), the diamine of Formula (2) or (3) is precipitated on the surface of the resin layer to form a rough surface with the decrease of the solvent in the resin layer. Therefore, by the present invention, a surface having a matting effect can be prepared without using a matting agent.

The second object of the above step (4) is to remove the group D or E from the diamine of Formula (2) or (3) and produce an —$NH_2$ group through reduction by continuously heating after the removal of the solvent, thereby forming a diamine of Formula (4). Then the diamine of Formula (4) is reacted with the amic acid ester oligomer of Formula (1), and a polyimide is formed after cyclization and polymerization.

In addition, in the step (4), the bubbles dissolved in the resin layer is expelled out with the volatilization of the solvent.

The heating temperature and time in the step (4) are not particularly limited and may be optionally adjusted, as long as they are sufficient for achieving the above objectives. The heating in the step (4) may be conducted in a single stage or in multiple stages. In a specific embodiment of the present invention, a two-stage heating process is adopted, where in a first stage, the heating is continued for 5 to 90 min at a temperature ranging from 70 to 170° C.; and in a second stage, the heating is continued for 60 to 240 min at a temperature ranging from 170 to 350° C.

Similarly, the non-photosensitive polyimide precursor composition may be directly applied to a substrate and subjected to a direct heating step to remove the solvent, and then the diamine compound is reacted with the amic acid ester oligomer to synthesize a polyimide, thus producing a surface with a matting effect.

2. Preparation of a Matting Surface with a Dry Film Containing a Photosensitive Polyimide Precursor Composition According to one embodiment of the present invention, a polyimide film or polyimide film laminate having a matting surface can be prepared with a dry film containing a photosensitive polyimide precursor composition.

The polyimide film or polyimide film laminate having a matting surface may be prepared through a process comprising the following steps:
(1) providing a dry film containing a photosensitive polyimide precursor composition;

(2) removing an optional protection film, and then laminating the dry film to a substrate in such a manner that the resin layer of the dry film faces the substrate;
(3) performing exposure, to crosslink the photosensitive group (e.g. a group having an ethylenically unsaturated bond) on the amic acid ester oligomer of Formula (1) with the oligomer, to cure the resin layer;
(4) removing the support carrier from the dry film;
(5) performing post-exposure bake to remove the solvent;
(6) performing development to remove the uncured resin layer; and
(7) heating to imidize the polyimide precursor composition into a polyimide.

The substrate may comprise a flexible circuit board, a wafer, a display or a touch panel or the like, or other optical or electronic components.

The lamination and operations in the step (2) are as described above.

As described above, after the step (2) and prior to the step (3), a pressurized bubble-dissolving operation which is well known to persons having ordinary skill in the art can be optionally carried out.

The exposure in the step (3) may be performed in any manner known to a person of ordinary skill in the art, for example, by using UV light, visible light, electron beam or laser irradiation, and preferably UV light. The exposure energy and time are not particularly limited, and may be adjusted by those of ordinary skill in the art as desired. According to an embodiment of the present invention, the exposure energy is about 600 to 800 mJ/cm$^2$.

The photosensitive polyimide precursor composition of the present invention has photosensitivity. By taking the use as a negative photoresist as an example, because the amic acid ester oligomer in the exposed region is crosslinked and cured, the solubility of the composition in the exposed region is different from that in the non-exposed region after exposure, whereby the composition in the non-exposed region can be removed, leaving a desired pattern (the step (6)). By taking the use as a positive photoresist as an example, for example, a photoacid generator can be added to produce an acidic environment in the exposed region for converting the amic acid ester oligomer into polyamic acid. Since the polyamic acid is highly soluble in an alkaline developing solution, the composition in the exposed region can be removed, leaving a desired pattern. Therefore, the photosensitive polyimide precursor composition of the present invention is applicable to a patterning process. In addition, by virtue of the above features, a photoresist layer does not needed to be additionally applied if the photosensitive polyimide precursor composition of the present invention is used, so the process steps are reduced, the circuit deformation caused by removal of the photoresist layer in the conventional patterning process can be avoided, and the yield of the patterning process is improved.

The surface of the support carrier that is attached to the resin layer may be a smooth surface or a rough surface, preferably a rough surface, more preferably a rough surface having an average surface roughness of not greater than 5 μm, and particularly preferably a rough surface having an average surface roughness of not greater than 3 μm. According to one embodiment of the present invention, the surface of the support carrier that is attached to the resin layer is a rough surface, and the rough surface structure of the support carrier can be transferred to the resin layer and cured into shape in the step (3). Therefore, even after the support carrier is removed in the step (4), the surface roughness of the resin layer in the exposed region can also be maintained, thereby enhancing the matting effect.

The above step (5) aims at remove the solvent by heating. The heating temperature and time in the step (5) are not particularly limited and may be optionally adjusted, as long as they are sufficient for achieving the above objective. The heating in the step (5) may be conducted in a single stage or in multiple stages. In a specific embodiment of the present invention, the heating is continued for 5 to 90 min at a temperature ranging from 70 to 170° C. In the step (5), the bubbles dissolved in the resin layer can be expelled out with the volatilization of the solvent; and the diamine of Formula (2) or (3) is precipitated out as the solvent in the resin layer is reduced. At this time, the thickness of the resin layer also decreases with the volatilization of the solvent, such that the precipitated diamine can further provide a matting effect.

In the step (6), the resin in the non-exposed area is dissolved and removed by performing development, and then rinsed with water, to obtain a desired pattern. The developing agent used is one well known to a person of ordinary skill in the art. Examples of the developing agent include, for example, but are not limited to, an aqueous $K_2CO_3$ solution, an aqueous $Na_2CO_3$ solution, an aqueous KOH solution, an aqueous NaOH solution, and an aqueous TMAH solution.

In addition, in the step (7), the group D or E is removed from the diamine of Formula (2) or (3) by heating and an —$NH_2$ group is formed through reduction, so as to form a diamine of Formula (4). Then the diamine of Formula (4) is reacted with the amic acid ester oligomer of Formula (1), and a polyimide is formed after cyclization and polymerization. The heating temperature and time in the step (7) are not particularly limited and may be optionally adjusted, as long as they are sufficient for achieving the above objectives. The heating in the step (7) may be conducted in a single stage or in multiple stages. In a specific embodiment of the present invention, the heating is continued for 60 to 240 min at a temperature ranging from 170 to 350° C. (preferably at a temperature below 300° C.).

Similarly, the photosensitive polyimide precursor composition may be directly applied to a substrate and subjected to a direct heating step to remove the solvent, and then the diamine compound is reacted with the amic acid ester oligomer to synthesize a polyimide, thus producing a surface with a matting effect.

IV. Applications of Matting Surface

As described herein, the polyimide precursor composition and the dry film of the present invention is beneficial to form a polyimide layer having a rough surface, thereby enhancing the adhesion force of the resulting polyimide layer and enabling the resulting polyimide layer to have a matting effect. The polyimide precursor composition and the dry film of the present invention are thus as applicable to, for example, a flexible printed circuit board as a coverlay, or semiconductors or active or passive components as an insulating material.

The following examples are provided for exemplifying the embodiments and illustrating the technical features of the present invention, and not intended to limit the scope of the present invention. Any changes or equivalent arrangements that may be readily achieved by persons skilled in the art are within the protection scope of the present invention as defined by the appended claims.

Preparation of Polyimide Precursor of Formula (1)

Preparation Example 1

21.81 g (0.1 mol) pyromellitic dianhydride (referred to hereinafter as PMDA) was dissolved in 200 g N-methyl-2- pyrrolidone (referred to hereinafter as NMP). The mixture obtained was then heated to 50° C. and agitated for reaction over 2 hours. 2.322 g (0.02 mol) 2-hydroxyethyl acrylate (referred to hereinafter as HEA) was slowly added dropwise and then the mixture was agitated for reaction over 2 hours at a fixed temperature of 50° C. Then, 18.018 g (0.09 mol) 4,4'-diamino-diphenyl ether (referred to hereinafter as ODA) was added to the solution, completely dissolved, and then agitated for reaction over 6 hr at a fixed temperature of 50° C., to obtain PAA-1.

Preparation Example 2

21.81 g (0.1 mol) PMDA was dissolved in 200 g NMP. The mixture obtained was then heated to 50° C. and agitated for reaction over 2 hours. 2.322 g (0.02 mol) HEA was slowly added dropwise, and agitated for reaction over 2 hours at a fixed temperature of 50° C. Then, 18.018 g (0.09 mol) ODA was added to the solution, completely dissolved, and agitated for reaction over 6 hr at a fixed temperature of 50° C. Finally, 9.309 g 2-(2-vinyloxyethoxy)ethyl acrylate (referred to hereinafter as VEEA) was added and agitated for reaction over 6 hr at a fixed temperature of 50° C., to obtain PAA-2.

Preparation Example 3

21.81 g (0.1 mol) PMDA was dissolved in 200 g NMP. The mixture obtained was then heated to 50° C. and agitated for reaction over 2 hours. 1.482 g (0.02 mol) 1-butanol (referred to hereinafter as nBA) was slowly added dropwise, and agitated for reaction over 2 hours at a fixed temperature of 50° C. Then, 18.018 g (0.09 mol) ODA was added to the solution, completely dissolved, and then agitated for reaction over 6 hr at a fixed temperature of 50° C., to obtain PAA-3.

Preparation Example 4

29.422 g (0.1 mol) biphenyl-tetracarboxylic acid dianhydride (referred to hereinafter as BPDA) was dissolved in 200 g NMP. The mixture obtained was then heated to 50° C. and agitated for reaction over 2 hours. 2.322 g (0.02 mol) HEA was slowly added dropwise, and agitated for reaction over 2 hours at a fixed temperature of 50° C. Then, 9.732 g (0.09 mol) p-Phenylenediamine (referred to hereinafter as pPDA) was added to the solution, completely dissolved, and then agitated for reaction over 6 hr at a fixed temperature of 50° C., to obtain PAA-4.

Preparation of Diamine of Formula (2) or (3)

Preparation Example 5

(Preparation of diamine of Formula (2), where D is

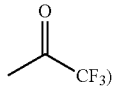

10.8140 g (0.1 mol) pPDA was added to the solvent toluene, and then 42.006 g (0.2 mol) trifluoroacetic acid anhydride (referred to hereinafter as TFAA) was slowly added with stirring, and agitated for reaction over 1 hour at a fixed temperature of 50° C., to obtain DA-1.

Preparation Example 6

(Preparation of diamine of Formula (2), where D is

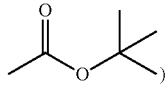

10.8140 g (0.1 mol) pPDA was fed to a reactor, and then 43.65 g (0.2 mol) di-tert-butyl dicarbonate (referred to hereinafter as Boc$_2$O) was added with stirring, and agitated for reaction over 1 hour at a fixed temperature of 50° C., to obtain DA-2.

Preparation Example 7

(Preparation of diamine of Formula (2), where D is H

10.8140 g (0.1 mol) pPDA was added to the solvent acetone, and completely dissolved. Then, 14.816 g (0.2 mol) ethyl formate (EF) was added, and agitated for reaction over 1 hour at a fixed temperature of 50° C., to obtain DA-3.

Preparation Example 8

(Preparation of diamine of Formula (2), where D is

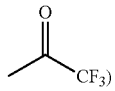

10.8140 g (0.1 mol) pPDA was added to the solvent acetone, and completely dissolved. Then, 20.418 g (0.2 mol) acetic anhydride (AA) was added, and agitated for reaction over 1 hour at a fixed temperature of 50° C., to obtain DA-4.

Preparation Example 9

(Preparation of diamine of Formula (2), where D is

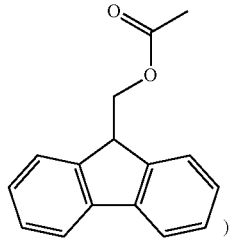 [SMILES: CC(=O)OCC1c2ccccc2-c2ccccc21]

10.8140 g (0.1 mol) pPDA was added to the solvent acetone, and completely dissolved. Then 51.74 g (0.2 mol)

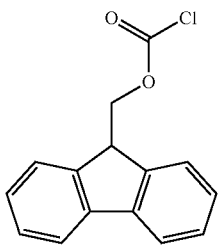 [SMILES: O=C(Cl)OCC1c2ccccc2-c2ccccc21]

was added, and agitated for reaction over 1 hour at a fixed temperature of 50° C. Then, triethylamine was added for neutralization. As a result, DA-5 was obtained.

Preparation Example 10

(Preparation of diamine of Formula (2), where D is

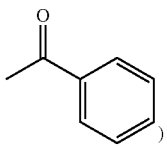
)

10.8140 g (0.1 mol) pPDA was added to the solvent acetone, and completely dissolved. Then 28.114 g (0.2 mol) benzoylchloride was added, and agitated for reaction over 1 hour at a fixed temperature of 50° C. Then, triethylamine was added for neutralization. As a result, DA-6 was obtained.

Preparation Example 11

(Preparation of diamine of Formula (2), where D is —C(CH$_3$)$_3$)

10.8140 g (0.1 mol) pPDA was added to the solvent acetone, and completely dissolved. Then 18.514 g (0.2 mol) tert-butyl chloride was added and agitated for reaction over 1 hour. Then, triethylamine was added for neutralization. As a result, DA-7 was obtained.

Preparation Example 12

(Preparation of diamine of Formula (2), where D is

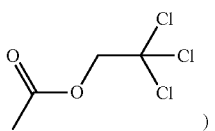
)

10.8140 g (0.1 mol) pPDA was added to the solvent acetone, and completely dissolved. Then 42.372 g (0.2 mol) 2,2,2-trichloroethyl chloroformate was added and agitated for reaction over 1 hour. Then, triethylamine was added for neutralization. As a result, DA-8 was obtained.

Preparation Example 13

(Preparation of diamine of Formula (3), where for the groups E at the same side, one is

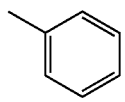

and the other is H)

10.8140 g (0.1 mol) pPDA was added to the solvent acetone, and completely dissolved. Then 21.2242 g (0.2 mol) benzaldehyde was added, and agitated for reaction over 24 hours at a fixed temperature of 50° C., to obtain DA-9.

Preparation Example 14

(Preparation of diamine of Formula (3), where for the groups E at the same side, one is

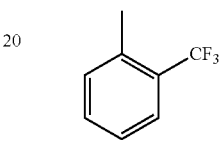

and the other is H)

10.8140 g (0.1 mol) pPDA was added to the solvent acetone, and completely dissolved. Then 34.824 g (0.2 mol) 2-(trifluoromethyl) benzaldehyde was added, and agitated for reaction over 24 hours at a fixed temperature of 50° C., to obtain DA-10.

Preparation Example 15

(Preparation of diamine of Formula (3), where the groups E at the same side are both

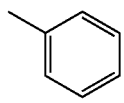
)

10.8140 g (0.1 mol) pPDA was added to the solvent acetone, and completely dissolved. Then 36.443 g (0.2 mol) benzophenone and a suitable catalyst were added, and agitated for reaction at room temperature, to obtain DA-11.

Preparation Example 16

(Preparation of diamine of Formula (3), where for the groups E at the same side, one is

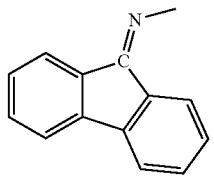

and the other is H)

10.8140 g (0.1 mol) pPDA was added to the solvent acetone, and completely dissolved. Then 36.04 g (0.2 mol) 9-fluorenone and a catalyst were added and agitated for reaction at room temperature, to obtain DA-12.

Preparation Example 17

(Preparation of diamine of Formula (2), where D is

32.023 g (0.1 mol) 2,2'-bis(trifluoromethyl)-4,4'-biphenyl-diamine (referred to hereinafter as TFMB) was added to the solvent acetone, and completely dissolved. Then 14.816 g (0.2 mol) ethyl formate (EF) was added, and agitated for reaction over 1 hour at a fixed temperature of 50° C., to obtain DA-13.

Preparation Example 18

(Preparation of diamine of Formula (2), where D is

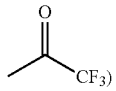

20.024 g (0.1 mol) ODA was added to the solvent toluene, and then 42.006 g (0.2 mol) TFAA was slowly added with stirring, and agitated for reaction over 1 hour at a fixed temperature of 50° C., to obtain DA-14.

Preparation Example 19

(Preparation of diamine of Formula (2), where D is

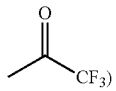

32.023 g (0.1 mol) TFMB was added to the solvent toluene, and then 42.006 g (0.2 mol) TFAA was slowly added with stirring, and agitated for reaction over 1 hour at a fixed temperature of 50° C., to obtain DA-15.

Preparation Example 20

(Preparation of diamine of Formula (2), where D is

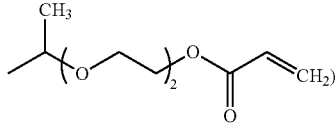

10.8140 g (0.1 mol) pPDA was added to the solvent acetone, and then 37.24 g (0.2 mol)

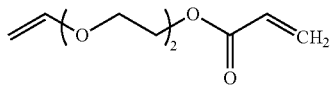

(2-(2-vinyloxyethoxy) ethyl acrylate) was added, and agitated for reaction over 24 hours at a fixed temperature of 50° C., to obtain DA-16.

Preparation Example 21

(Preparation of diamine of Formula (2), where D is

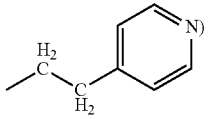

10.8140 g (0.1 mol) pPDA was added to the solvent acetone, and then 21.02 g (0.2 mol)

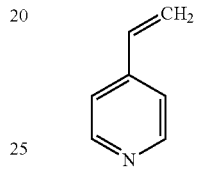

(4-vinylpyridine) and 0.2 g reaction catalyst Amberlyst®15 were added, and agitated for reaction over 24 hours at a fixed temperature of 90° C., to obtain DA-17.

Preparation Example 22

(Preparation of diamine of Formula (2), where D is

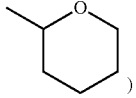

10.8140 g (0.1 mol) pPDA was added to the solvent acetone and then 16.82 g (0.2 mol)

(3,4-Dihydro-2H-pyran) was added, and agitated for reaction over 24 hours at a fixed temperature of 50° C., to obtain DA-18.

Polyimide Precursor Composition and Dry Film Containing the Polyimide Precursor Composition

Example 1

2.479 g diamine DA-1 was added to 200 g amic acid oligomer PAA-1 and mixed until uniform. Then 100 g N,N-dimethylcapramide (DMC), and 0.5 g photoinitiator (Ciba; Irgacure OXE-01) were added, to obtain a polyimide precursor composition PAA-C1.

The polyimide precursor composition PAA-C1 prepared above was evenly coated onto a smooth PET film (Mitsubishi Plastic; R310) by a blade, and baked for 5 min in a hot air circulation drying oven at 95° C., to obtain a polyimide precursor composition dry film DF-1 (where the film thickness is about 40 μm and the solvent content is about 50%).

Example 2

The process was the same as that in Example 1, except that the diamine was 2.546 g diamine DA-2. A polyimide precursor composition PAA-C2 and a polyimide precursor composition dry film DF-2 (where the film thickness is about 40 μm and the solvent content is about 50%) were prepared.

Example 3

The process was the same as that in Example 1, except that the diamine was 4.56 g diamine DA-5. A polyimide precursor composition PAA-C3 and a polyimide precursor composition dry film DF-3 (where the film thickness is about 40 μm and the solvent content is about 50%) were prepared.

Example 4

The process was the same as that in Example 1, except that the diamine was 1.819 g diamine DA-7. A polyimide precursor composition PAA-C4 and a polyimide precursor composition dry film DF-4 (where the film thickness is about 40 μm and the solvent content is about 50%) were prepared.

Example 5

The process was the same as that in Example 1, except that the diamine was 3.79 g diamine DA-8. A polyimide precursor composition PAA-C5 and a polyimide precursor composition dry film DF-5 (where the film thickness is about 40 μm and the solvent content is about 50%) were prepared.

Example 6

The process was the same as that in Example 1, except that the diamine was 3.4713 g diamine DA-10. A polyimide precursor composition PAA-C6 and a polyimide precursor composition dry film DF-6 (where the film thickness is about 40 μm and the solvent content is about 50%) were prepared.

Example 7

The process was the same as that in Example 1, except that the diamine was 3.605 g diamine DA-11. A polyimide precursor composition PAA-C7 and a polyimide precursor composition dry film DF-7 (where the film thickness is about 40 μm and the solvent content is about 50%) were prepared.

Example 8

The process was the same as that in Example 1, except that the diamine was 3.572 g diamine DA-12. A polyimide precursor composition PAA-C8 and a polyimide precursor composition dry film DF-8 (where the film thickness is about 40 μm and the solvent content is about 50%) were prepared.

Example 9

The process was the same as that in Example 1, except that 200 g PAA-2 and 2.386 g DA-1 were used. A polyimide precursor composition PAA-C9 and a polyimide precursor composition dry film DF-9 (where the film thickness is about 40 μm and the solvent content is about 50%) were prepared.

Example 10

The process was the same as that in Example 1, except that 200 g PAA-3 and 2.487 g DA-1 were used and the amount of the photoinitiator was 0 g. A polyimide precursor composition PAA-C10 and a polyimide precursor composition dry film DF-10 (where the film thickness is about 40 μm and the solvent content is about 50%) were prepared.

Example 11

The polyimide precursor composition PAA-C1 prepared in Example 1 was evenly coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-11 (where the film thickness is about 40 μm and the solvent content is about 50%).

Example 12

The polyimide precursor composition PAA-C10 prepared in Example 10 was coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-12 (where the film thickness is about 40 μm and the solvent content is about 50%).

Example 13

The process was the same as that in Example 1, except that 4.245 g diamine DA-13 was used. A polyimide precursor composition PAA-C13 was prepared. The PAA-C13 was evenly coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-13 (where the film thickness is about 40 μm and the solvent content is about 50%).

Example 14

The process was the same as that in Example 1, except that the diamine was 1.355 g diamine DA-3. A polyimide precursor composition PAA-C14 and a polyimide precursor composition dry film DF-14 (where the film thickness is about 40 μm and the solvent content is about 50%) were prepared.

Example 15

The process was the same as that in Example 1, except that the diamine was 1.587 g diamine DA-4. A polyimide precursor composition PAA-C15 and a polyimide precursor composition dry film DF-15 (where the film thickness is about 40 μm and the solvent content is about 50%) were prepared.

Example 16

The process was the same as that in Example 1, except that the diamine was 2.612 g diamine DA-6. A polyimide precursor composition PAA-C16 and a polyimide precursor composition dry film DF-16 (where the film thickness is about 40 μm and the solvent content is about 50%) were prepared.

Example 17

The process was the same as that in Example 1, except that the diamine was 2.348 g diamine DA-9. A polyimide precursor composition PAA-C17 and a polyimide precursor composition dry film DF-17 (where the film thickness is about 40 μm and the solvent content is about 50%) were prepared.

Example 18

The process was the same as that in Example 1, except that the diamine was 2.4219 g diamine DA-14. A polyimide precursor composition PAA-C18 and a polyimide precursor composition dry film DF-18 (where the film thickness is about 40 μm and the solvent content is about 50%) were prepared.

Example 19

The process was the same as that in Example 1, except that the diamine was 4.2306 g diamine DA-15. A polyimide precursor composition PAA-C19 and a polyimide precursor composition dry film DF-19 (where the film thickness is about 40 μm and the solvent content is about 50%) were prepared.

Example 20

The process was the same as that in Example 1, except that the diamine was 3.968 g diamine DA-16. A polyimide precursor composition PAA-C20 and a polyimide precursor composition dry film DF-20 (where the film thickness is about 40 μm and the solvent content is about 50%) were prepared.

Example 21

The process was the same as that in Example 1, except that the diamine was 2.629 g diamine DA-17. A polyimide precursor composition PAA-C21 and a polyimide precursor composition dry film DF-21 (where the film thickness is about 40 μm and the solvent content is about 50%) were prepared.

Example 22

The process was the same as that in Example 1, except that the diamine was 2.034 g diamine DA-18. A polyimide polyimide precursor composition PAA-C22 and a polyimide precursor composition dry film DF-22 (where the film thickness is about 40 μm and the solvent content is about 50%) were prepared.

Example 23

The process was the same as that in Example 1, except that 200 g PAA-4 and 2.4859 g diamine DA-1 were used. A polyimide precursor composition PAA-C23 and a polyimide precursor composition dry film DF-23 (where the film thickness is about 40 μm and the solvent content is about 50%) were prepared.

Comparative Example 1

The process was the same as that in Example 1, except that the diamine was 0.825 g pPDA. A polyimide precursor composition PAA-C24 and a polyimide precursor composition dry film DF-24 (where the film thickness is about 40 μm and the solvent content is about 50%) were prepared.

Comparative Example 2

The process was the same as that in Example 1, except that the diamine was 2.44 g TFMB. A polyimide precursor composition PAA-C25 and a polyimide precursor composition dry film DF-25 (where the film thickness is about 40 μm and the solvent content is about 50%) were prepared.

Comparative Example 3

The process was the same as that in Example 1, except that the diamine was 1.527 g ODA. A polyimide precursor composition PAA-C26 and a polyimide precursor composition dry film DF-26 (where the film thickness is about 40 μm and the solvent content is about 50%) were prepared.

Comparative Example 4

0.896 g pPDA was added to 200 g PAA-3, and mixed until uniform. Then 100 g DMC was added to prepare a polyimide precursor composition PAA-C27. The PAA-C27 was coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-27 (where the film thickness is about 40 μm and the solvent content is about 50%).

Comparative Example 5

2.654 g TFMB was added to 200 g PAA-3, and mixed until uniform. Then 100 g DMC was added, to prepare a polyimide precursor composition PAA-C28. The PAA-C28 was coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-28 (where the film thickness is about 40 μm and the solvent content is about 50%).

Comparative Example 6

1.6595 g ODA was added to 200 g PAA-3, and mixed until uniform. Then 100 g DMC was added to prepare a polyimide precursor composition PAA-C29. The PAA-C29 was coated onto a rough surface of a PET film (Teijin; PS-1, average surface roughness is 0.25 μm) by a blade, and baked for 5 min in a hot air circulation drying oven at 95° C., to obtain a polyimide precursor composition dry film DF-29 (where the film thickness is about 40 μm and the solvent content is about 50%).

Preparation of Polyimide Film
i. Non-Photosensitive Polyimide Precursor Composition The dry films in Examples 10 and 12 and Comparative Examples 4, 5 and 6 were laminated to a flexible copper clad laminate by a hot roller in such a manner such that the resin layer faces the flexible copper clad laminate (manufactured by AZOTEK CO., LTD.; Model: ADS1212ME1), and then the PET film was removed from the dry film, and the remaining portion was baked in an oven at a temperature ramping from room temperature to 150° C. over 35 min and maintained at 150° C. for 60 min in a first stage; and then ramping from 150 to 250° C. and maintained at 250° C. for 120 min in a second stage, to obtain a polyimide film.

2. Photosensitive Polyimide Precursor Composition

Except for the dry films in Examples 10 and 12 and Comparative Examples 4, 5 and 6, the remaining dry films were laminated to a flexible copper clad laminate by a hot roller in such a manner such that the resin layer faces the flexible copper clad laminate (manufactured by AZOTEK CO., LTD.; Model: ADS1212ME1), and then exposed at an energy of 600-800 mJ/cm² by using a UV exposure machine, and then the PET film was removed from the dry film. The remaining portion was baked continuously for 30 min in an oven at a temperature ranging from 70 to 90° C., and then developed with 1 wt % aqueous $K_2CO_3$ solution, followed by baking in an oven at a temperature ramping from room temperature to 150° C. over 35 min and maintained at 150° C. for 60 min in a first stage; and then ramping from 150 to 250° C. and maintained at 250° C. for 120 min in a second stage, to obtain a polyimide film.

Test Methods

Storage Stability:

The polyimide precursor compositions prepared in the examples and comparative examples were placed in an environment with a controlled temperature and humidity (25° C.; 55% RH). The change in the viscosity of the polyimide precursor composition at various storage time was measured by using the Brookfield viscometer, and the number of days when the viscosity is elevated or reduced to 50% of the initial viscosity was recorded.

Measurement of the Coefficient of Thermal Expansion (CTE) of the Polyimide Layer The CTE data of the polyimide film was measured by using a thermomechanical analyzer (TMA, a TA Q400 instrument manufactured by Texas Instruments Incorporated). The measurement range was between 0 and 500° C., and the temperature was increased at 10° C./min.

Thermal Degradation Test:

The $Td_5\%$ data of the polyimide film was measured by using a thermogravimetric analyzer (TMA, a TA Q5000 instrument manufactured by Texas Instruments Incorporated). The measurement range was between 0 and 600° C., and the temperature was increased at 10° C./min.

Gloss Test:

600 gloss of the film was measured by using a glossmeter. The lower gloss value means that the matting effect is better.

Related Test Results are Shown in Table 1

TABLE 1

| | Amic acid oligomer | Diamine | PET | Photosensitivity (UV) | Storage stability (d) | Thermal degradation (° C.) | CTE (ppm/° C.) | Gloss |
|---|---|---|---|---|---|---|---|---|
| Example 1 | PAA-1 | DA-1 | R310 | ◎ | 27 | 570 | 32 | 8.1 |
| Example 2 | PAA-1 | DA-2 | R310 | ◎ | 25 | 560 | 31 | 8.7 |
| Example 3 | PAA-1 | DA-5 | R310 | ◎ | 31 | 555 | 30 | 12.1 |
| Example 4 | PAA-1 | DA-7 | R310 | ◎ | 30 | 545 | 36 | 10.1 |
| Example 5 | PAA-1 | DA-8 | R310 | ◎ | 35 | 561 | 32 | 9.7 |
| Example 6 | PAA-1 | DA-10 | R310 | ◎ | 26 | 550 | 34 | 13.6 |
| Example 7 | PAA-1 | DA-11 | R310 | ◎ | 33 | 548 | 33 | 15.4 |
| Example 8 | PAA-1 | DA-12 | R310 | ◎ | 30 | 551 | 35 | 17.2 |
| Example 9 | PAA-2 | DA-1 | R310 | ◎ | 28 | 568 | 30 | 8.2 |
| Example 10 | PAA-3 | DA-1 | R310 | X | 24 | 570 | 31 | 10.3 |
| Example 11 | PAA-1 | DA-1 | PS-1 | ◎ | 23 | 563 | 32 | 8.5 |
| Example 12 | PAA-3 | DA-1 | PS-1 | X | 26 | 571 | 31 | 9.1 |
| Example 13 | PAA-1 | DA-13 | PS-1 | ◎ | 31 | 535 | 35 | 8.3 |
| Example 14 | PAA-1 | DA-3 | R310 | ◎ | 35 | 563 | 31 | 31 |
| Example 15 | PAA-1 | DA-4 | R310 | ◎ | 39 | 545 | 36 | 25 |
| Example 16 | PAA-1 | DA-6 | R310 | ◎ | 33 | 540 | 34 | 19 |
| Example 17 | PAA-1 | DA-9 | R310 | ◎ | 29 | 549 | 33 | 13 |
| Example 18 | PAA-1 | DA-14 | R310 | ◎ | 30 | 563 | 37 | 10.1 |
| Example 19 | PAA-1 | DA-15 | R310 | ◎ | 24 | 553 | 36 | 8.1 |
| Example 20 | PAA-1 | DA-16 | R310 | ◎ | 29 | 535 | 33 | 35 |
| Example 21 | PAA-1 | DA-17 | R310 | ◎ | 35 | 530 | 38 | 15 |
| Example 22 | PAA-1 | DA-18 | R310 | ◎ | 27 | 563 | 31 | 12.1 |
| Example 23 | PAA-4 | DA-1 | R310 | ◎ | 27 | 581 | 25 | 8.3 |
| Comparative Example 1 | PAA-1 | pPDA | R310 | ◎ | 7 | 565 | 34 | 62 |
| Comparative Example 2 | PAA-1 | TFMB | R310 | ◎ | 10 | 574 | 34 | 58 |
| Comparative Example 3 | PAA-1 | ODA | R310 | ◎ | 6 | 543 | 36 | 64 |
| Comparative Example 4 | PAA-3 | pPDA | PS-1 | X | 7 | 568 | 36 | 55 |
| Comparative Example 5 | PAA-3 | TFMB | PS-1 | X | 10 | 558 | 29 | 50 |
| Comparative Example 6 | PAA-3 | ODA | PS-1 | X | 5 | 556 | 38 | 49 |

As can be seen from the results in Table 1, in comparison with the comparative examples, the polyimide precursor composition of the present invention contains the diamine of Formula (2) or (3) so that the storage stability is better, and whether the polyimide precursor composition is photosensitive or non-photosensitive, the gloss values are lower than that of the comparative examples. Therefore, the polyimide precursor composition of the present invention is suitable for producing a matting surface. In addition, the polyimide precursor composition of the present invention can be used with a smooth or coarse PET film to produce a matting surface with a low glossiness. On the contrary, the surfaces made from the polyimide precursor compositions of Comparative Examples 1 to 3 have a gloss value of 49 or greater, so a matting surface cannot be efficiently produced with the polyimide precursor compositions of Comparative Examples 1 to 3.

The above-described embodiments of the present invention are intended to be illustrative only. Numerous alternative embodiments may be devised by persons skilled in the art without departing from the scope of the following claims.

What is claimed is:

1. A polyimide precursor composition comprising an amic acid ester oligomer of Formula (1):

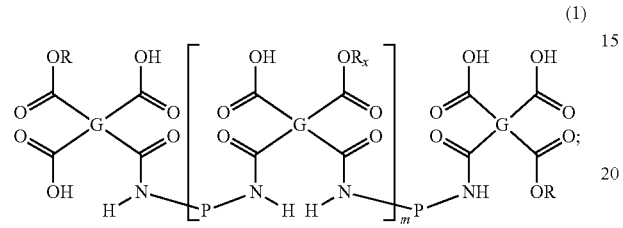

a diamine of Formula (2) or (3):

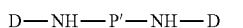

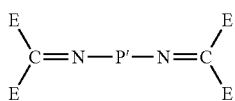

wherein:
G is each independently a tetravalent organic group;
P is each independently a divalent organic group;
R is each independently $C_1$-$C_{14}$ alkyl; $C_6$-$C_{14}$ aryl unsubstituted or substituted with one or more groups selected from hydroxyl and $C_1$-$C_4$ alkyl; or a group having an ethylenically unsaturated bond;
$R_x$ is each independently H, $C_1$-$C_8$ alkyl, or an ethylenically unsaturated group;
P' is each independently a divalent organic group;
D is each independently $C_1$-$C_8$ alkyl unsubstituted or substituted with one or more groups selected from $C_6$-$C_{14}$ aryl and a heterocyclyl group containing nitrogen; $C_1$-$C_8$ haloalkyl; a heterocyclyl group containing oxygen unsubstituted or substituted with one or more groups selected from $C_1$-$C_8$ alkyl, $C_1$-$C_8$ hydroxyalkyl, oxo, and —$NO_2$; a heterocyclyl group containing nitrogen unsubstituted or substituted with one or more groups selected from oxo, $C_1$-$C_8$ alkyl, and —$NO_2$;

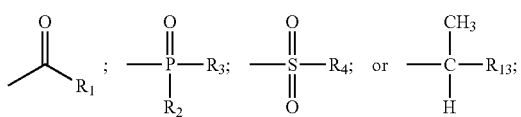

$R_1$ is H; $C_6$-$C_{14}$ aryl unsubstituted or substituted with one or more groups selected from $C_1$-$C_8$ alkyl and $C_1$-$C_8$ haloalkyl; a heterocyclyl group containing nitrogen; $C_4$-$C_{10}$ cycloalkyl; $C_1$-$C_8$ alkyl or $C_1$-$C_8$ alkoxy unsubstituted or substituted with one or more groups selected from $C_6$-$C_{14}$ aryl, a heterocyclyl group containing nitrogen, —S—$R_4$,

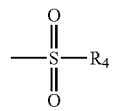

and —CN; $C_1$-$C_8$ haloalkyl; $C_1$-$C_8$ haloalkoxy; or —$NR_5R_6$;
$R_{13}$ is

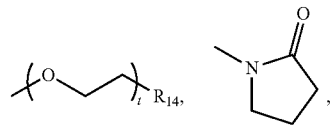

—$OR_{15}$ or $C_1$-$C_{10}$ alkoxy;
$R_2$, $R_3$, $R_4$, $R_5$ and $R_6$ may be the same or different and are each independently H; $C_1$-$C_8$ alkyl or $C_1$-$C_8$ alkoxy unsubstituted or substituted with one or more $C_6$-$C_{14}$ aryl; $C_6$-$C_{14}$ aryl or $C_6$-$C_{14}$ aryloxy unsubstituted or substituted with one or more groups selected from $C_1$-$C_8$ alkyl and —$NO_2$; halo; $C_1$-$C_8$ haloalkyl; or a heterocyclyl group containing nitrogen;
$R_{14}$ is (meth)acryloyloxy;
$R_{15}$ is a $C_4$-$C_{10}$ cycloalkyl or a heterocyclyl group containing oxygen;
t is an integer from 1 to 20;
E is each independently H; $C_1$-$C_{14}$ alkyl; alkylamino; alkylthio; $C_4$-$C_{10}$ cycloalkyl; a heterocyclyl group containing nitrogen or

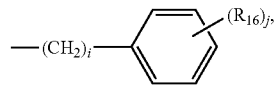

with the provision that two E attached to the same carbon atom are not H at the same time;
or alternatively, two E attached to the same carbon atom form, together with the carbon atom, a $C_6$-$C_{14}$ aryl group or a heterocyclyl group;
$R_{16}$ is each independently halo, hydroxyl, $C_1$-$C_8$ alkoxy, $C_1$-$C_8$ haloalkyl, or —$NO_2$;
i is an integer from 0 to 3;
j is an integer from 0 to 3; and
m is an integer from 1 to 100.

2. The composition according to claim 1, wherein the group having an ethylenically unsaturated bond is selected from the group consisting of ethenyl, propenyl, methylpropenyl, n-butenyl, iso-butenyl, ethenylphenyl, propenylphenyl, propenyloxymethyl, propenyloxyethyl, propenyloxypropyl, propenyloxybutyl, propenyloxypentyl, propenyloxyhexyl, methylpropenyloxymethyl, methylpropenyloxyethyl, methylpropenyloxypropyl, methylpropenyloxybutyl, methylpropenyloxypentyl, methylpropenyloxyhexyl, and a group of Formula (2):

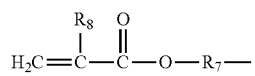

where $R_7$ is phenylene, $C_1$-$C_8$ alkylene, $C_2$-$C_8$ alkenylene, $C_3$-$C_8$ cycloalkylene, $C_1$-$C_8$ hydroxyalkylene, or

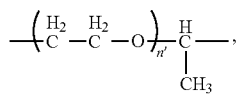

in which n' is an integer from 1 to 4, and $R_8$ is hydrogen or $C_1$-$C_4$ alkyl.

3. The composition according to claim 1, wherein R is each independently selected from the group consisting of:

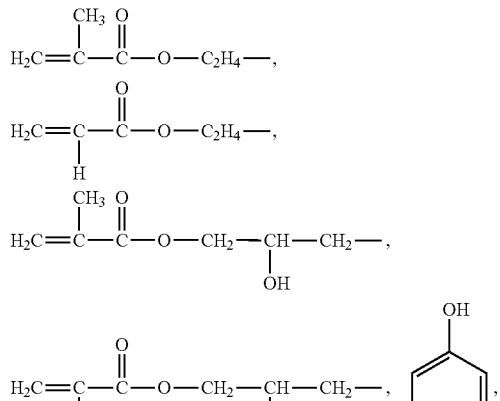

—$CH_3$,   —$CH_2CH_3$,   —$CH_2CH_2CH_3$,

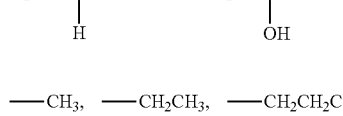

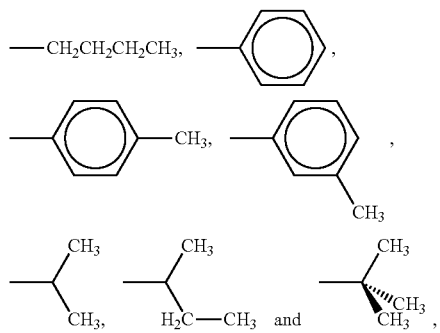

4. The composition according to claim 1, wherein the tetravalent organic group is each independently selected from the group consisting of:

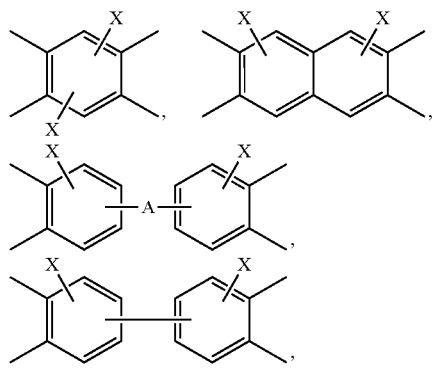

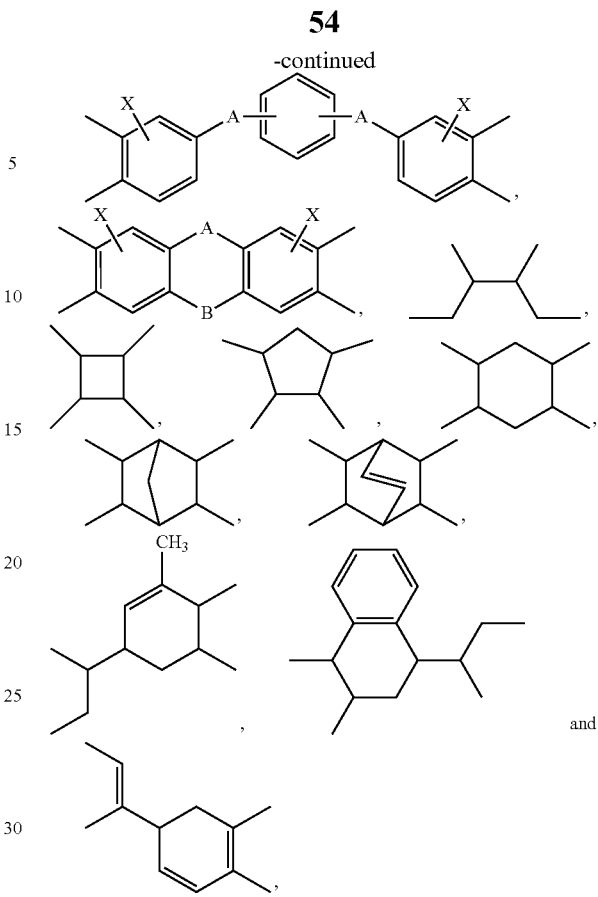

wherein X is each independently hydrogen, halo, $C_1$-$C_4$ perfluoroalkyl, or $C_1$-$C_4$ alkyl; and A and B at each occurrence are each independently a covalent bond, $C_1$-$C_4$ alkylene unsubstituted or substituted with one or more groups selected from hydroxyl and $C_1$-$C_4$ alkyl, $C_1$-$C_4$ perfluoroalkylene, $C_1$-$C_4$ alkyleneoxy, silylene, —O—, —S—, —C(O)—, —OC(O)—, —S(O)$_2$—, —C(=O)O—($C_1$-$C_4$ alkylene)-OC(=O)—, —CONH—, phenyl, biphenylyl, or

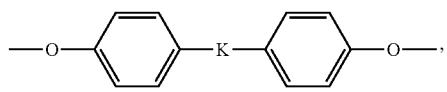

wherein K is —O—, —S(O)$_2$—, $C_1$-$C_4$ alkylene or $C_1$-$C_4$ perfluoroalkylene.

5. The composition according to claim 1, wherein the divalent organic group is each independently selected from the group consisting of:

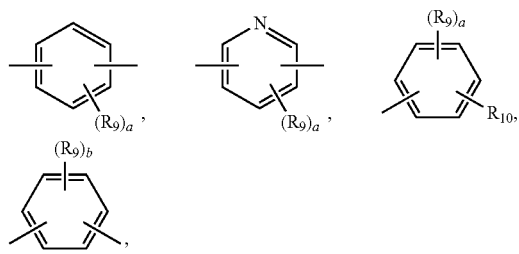

-continued

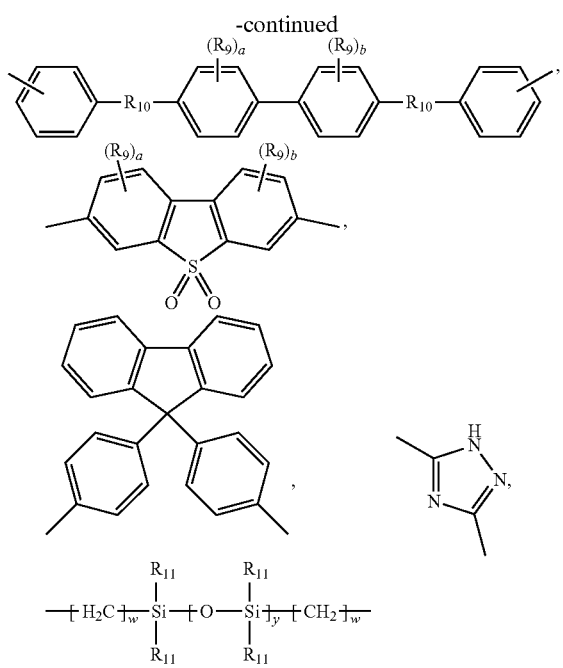

and the combination thereof;
wherein:
$R_9$ is each independently H, $C_1$-$C_4$ alkyl, $C_1$-$C_4$ perfluoroalkyl, $C_1$-$C_4$ alkoxy, halo, —OH, —COOH, —$NH_2$ or —SH;
a is each independently an integer from 0 to 4;
b is each independently an integer from 0 to 4; and
$R_{10}$ is a covalent bond or a group selected from the group consisting of:

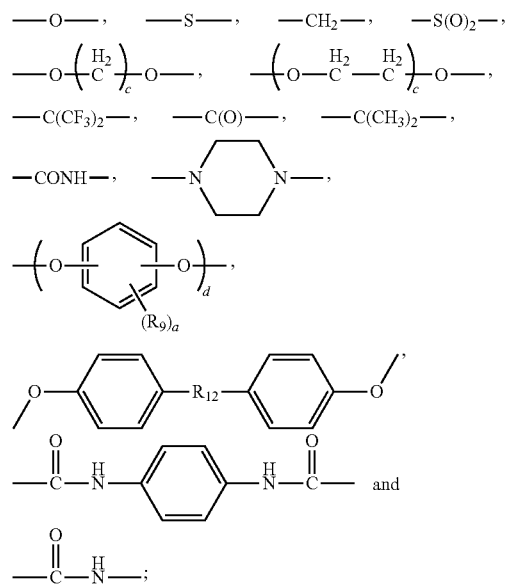

wherein:
c and d are each independently an integer from 1 to 20;
$R_9$ and a are as defined above;
$R_{12}$ is —S(O)$_2$—, —C(O)—, a covalent group, $C_1$-$C_4$ alkyl or $C_1$-$C_4$ perfluoroalkyl;

$R_{11}$ is each independently hydrogen, halo, phenyl, $C_1$-$C_4$ alkyl, or $C_1$-$C_4$ perfluoroalkyl; and
w and y are each an integer from 1 to 3.

6. The composition according to claim 1, wherein the substituent D is:
   (i) $C_1$-$C_8$ alkyl unsubstituted or substituted with one or more groups selected from $C_6$-$C_4$ aryl and a 5- or 6-membered heterocyclyl group containing nitrogen; $C_1$-$C_8$ haloalkyl; a 5- or 6-membered heterocyclyl group containing oxygen unsubstituted or substituted with one or more groups selected from $C_1$-$C_8$ alkyl and $C_1$-$C_8$ hydroxyalkyl; or a 5- or 6-membered heterocyclyl group containing nitrogen substituted with one or more groups selected from $C_1$-$C_8$ alkyl, oxo and —$NO_2$;

(ii)

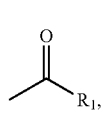

wherein $R_1$ is pyrrolyl, imidazolyl, pyrazolyl, pyrimidinyl, pyridinyl, H, $C_1$-$C_8$ alkyl, $C_1$-$C_8$ haloalkyl, $C_6$-$C_{14}$ aryl, $C_1$-$C_8$ alkoxy, $C_1$-$C_8$ haloalkoxy, $C_6$-$C_{14}$ aryl-$C_1$-$C_8$ alkoxy, —NH($C_6$-$C_{14}$ aryl), —NH($C_1$-$C_8$ alkyl), or the following groups:

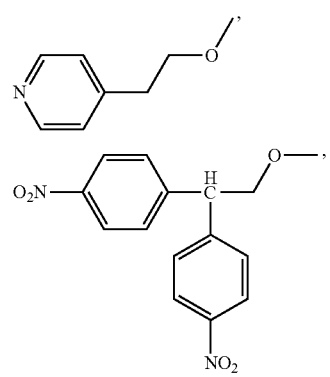

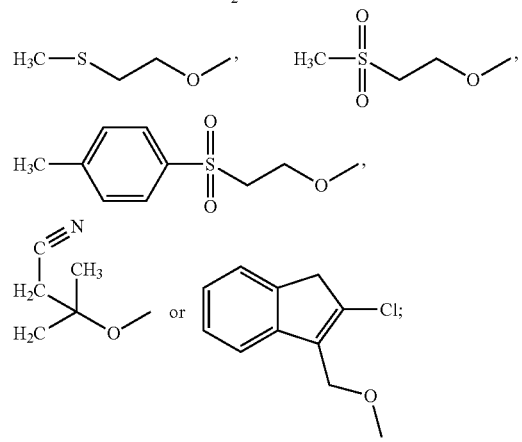

(iii)

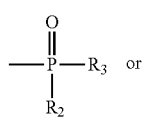

-continued

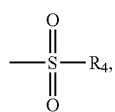

wherein $R_2$ and $R_3$ are each independently H, $C_1$-$C_8$ alkyl, $C_6$-$C_{14}$ aryl, $C_1$-$C_8$ alkyl substituted with one or more $C_6$-$C_{14}$ aryl, or halo; and $R_4$ is H, $C_1$-$C_8$ alkyl, $C_6$-$C_{14}$ aryl, $C_1$-$C_8$ alkyl substituted with one or more $C_6$-$C_{14}$ aryl, $C_1$-$C_8$ haloalkyl,

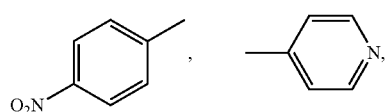

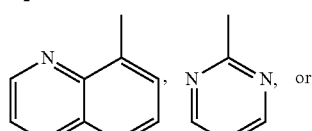

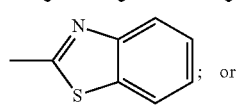

; or (iv)

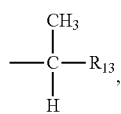

wherein $R_{13}$ is

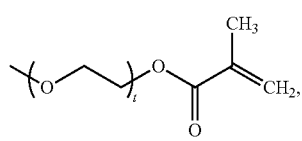

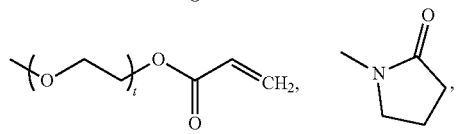

$C_1$-$C_8$ alkoxy,

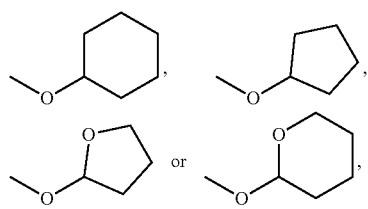

and t is an integer from 1 to 5.

7. The composition according to claim 1, wherein the substituent D is the same or different and is each independently methyl, ethyl, propyl, butyl, or selected from the following groups:

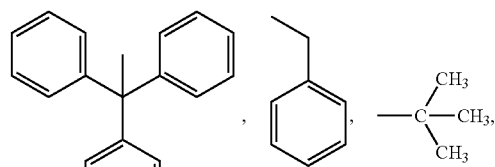

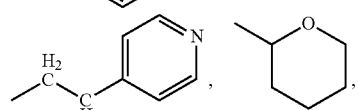

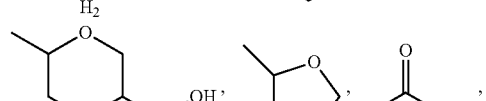

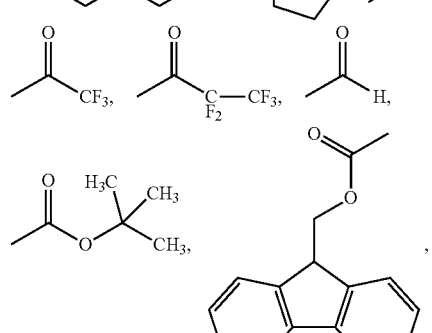

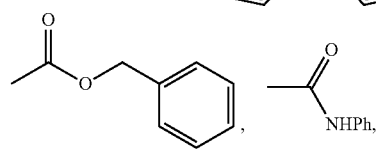

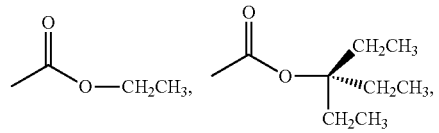

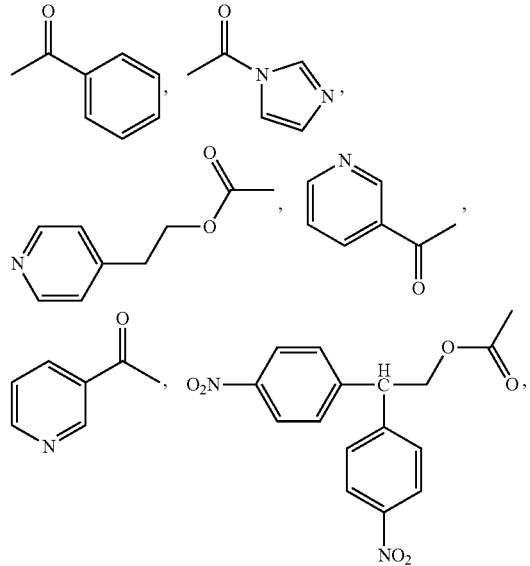

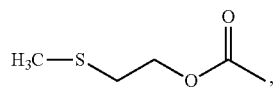

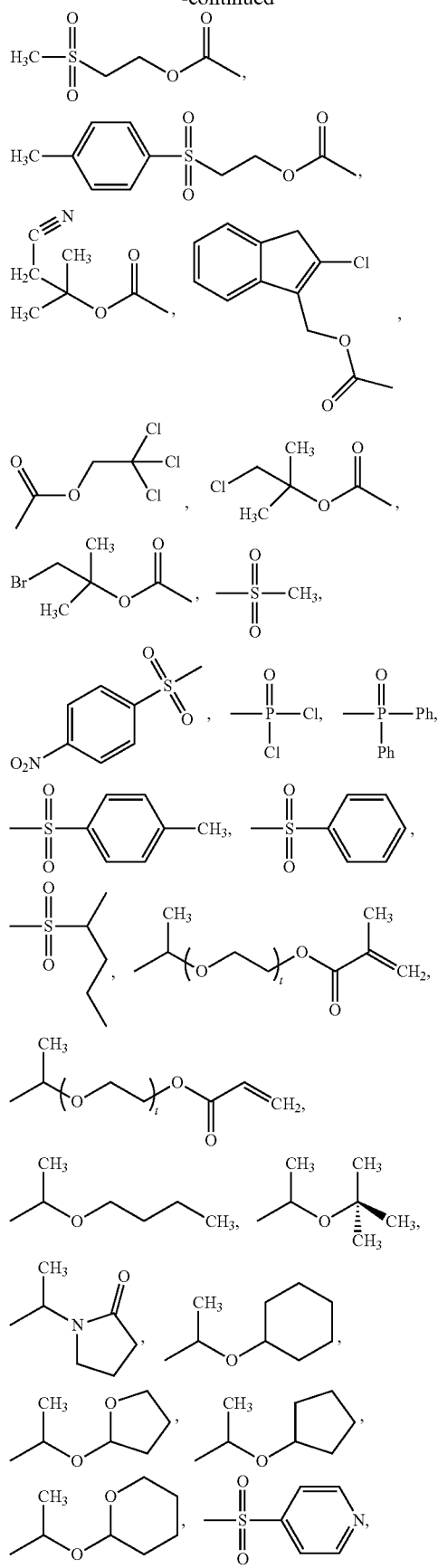
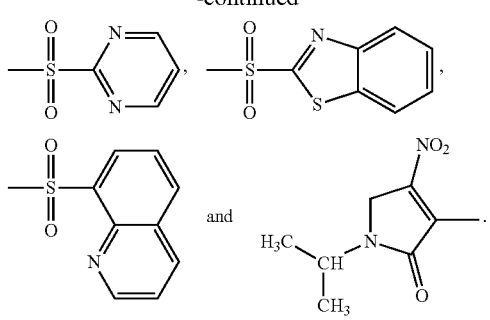
wherein t is an integer from 1 to 5.
8. The composition according to claim 1, wherein the substituent E is the same or different and is each independently H, phenyl,
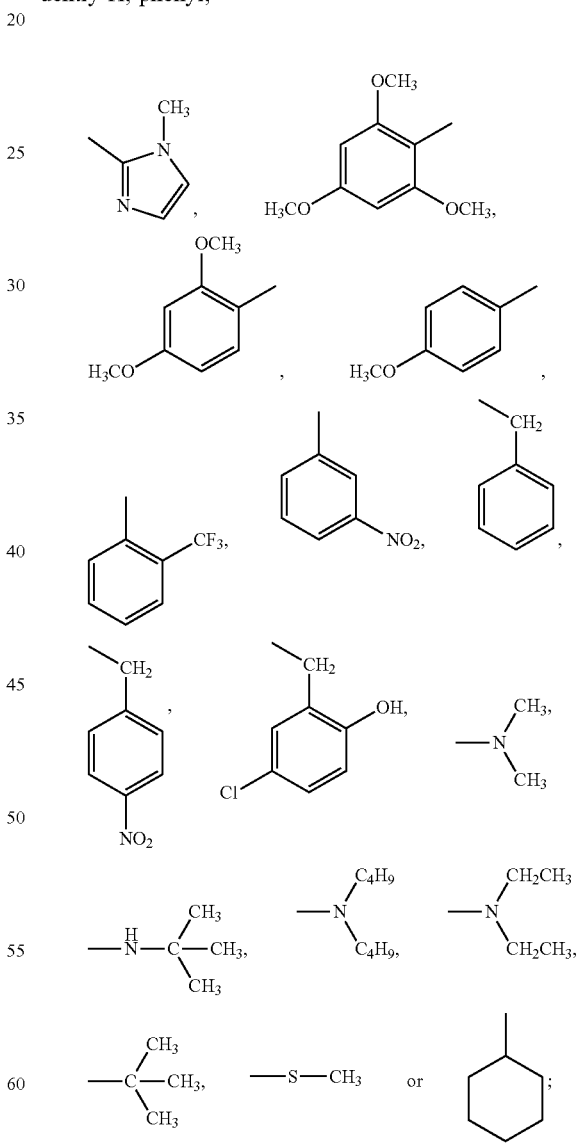
two E attached to the same carbon atom form, together with the carbon atom, a $C_6$-$C_{14}$ aryl group or a heterocyclyl group such that the moiety

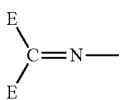

in Formula (3) has a structure of:

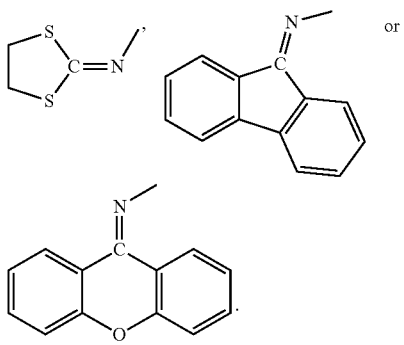

9. The composition according to claim 1, wherein m is an integer from 1 to 15.

10. The composition according to claim 1, further comprising a photoinitiator.

11. The composition according to claim 1, further comprising a solvent wherein the solvent is selected from the group consisting of dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol monomethyl ether, tetraethylene glycol dimethyl ether, methanol, ethanol, butanol, butylcellosolve, γ-butyrolactone, xylene, toluene, hexamethylphosphoramide, propylene glycol monomethyl ether acetate,

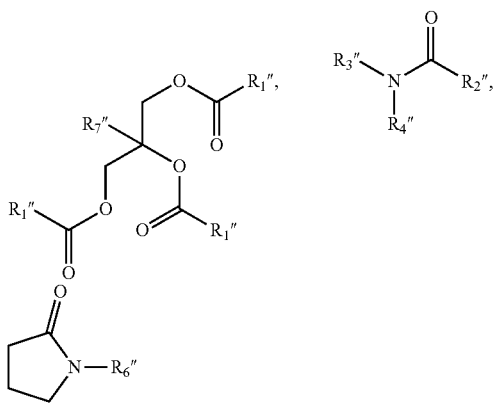

and
a mixture thereof,
wherein:
$R_1''$ is each independently H, $C_1$-$C_{20}$ alkyl, $C_2$-$C_{20}$ alkenyl or $C_2$-$C_{20}$ alkynyl;
$R_7''$ is H or $C_1$-$C_3$ alkyl;
$R_2''$ is H, $C_1$-$C_{15}$ alkyl or $C_4$-$C_8$ cycloalkyl;
$R_3''$ and $R_4''$ are each independently $C_1$-$C_{10}$ alkyl, or $R_3''$ and $R_4''$ form, together with the nitrogen atom to which they are attached, a 5- to 6-membered heterocyclic ring; and
$R_6''$ is $C_1$-$C_{15}$ alkyl, $C_2$-$C_{20}$ alkenyl or $C_4$-$C_8$ cycloalkyl.

12. A dry film comprising a support carrier and a resin layer on the support carrier wherein the resin layer comprises the composition according to claim 1, and wherein the resin layer has a solvent content of at least 5 wt % based on the total weight of the resin layer.

13. The dry film according to claim 12, wherein the solvent content ranges from 15 to 60 wt % based on the total weight of the resin layer.

14. The dry film according to claim 12, wherein the solvent is selected from the group consisting of dimethyl sulfoxide, diethyl sulfoxide, phenol, o-cresol, m-cresol, p-cresol, xylenol, halogenated phenol, pyrocatechol, tetrahydrofuran, dioxane, dioxolane, propylene glycol monomethyl ether, tetraethylene glycol dimethyl ether, methanol, ethanol, butanol, butylcellosolve, γ-butyrolactone, xylene, toluene, hexamethylphosphoramide, propylene glycol monomethyl ether acetate,

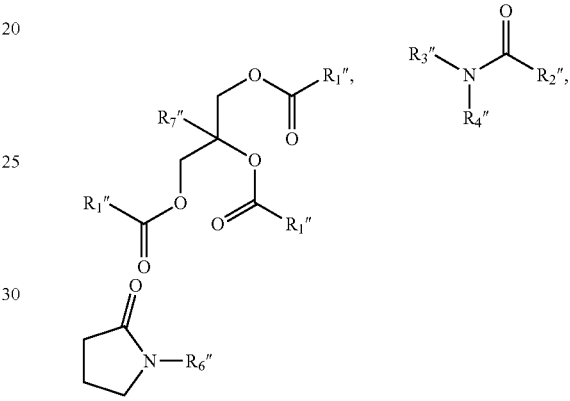

and a mixture thereof,
wherein:
$R_1''$ is each independently H, $C_1$-$C_{20}$ alkyl, $C_2$-$C_{20}$ alkenyl or $C_2$-$C_{20}$ alkynyl;
$R_7''$ is H or $C_1$-$C_3$ alkyl;
$R_2''$ is H, $C_1$-$C_{15}$ alkyl or $C_4$-$C_8$ cycloalkyl;
$R_3''$ and $R_4''$ are each independently $C_1$-$C_{10}$ alkyl, or $R_3''$ and $R_4''$ form, together with the nitrogen atom to which they are attached, a 5- to 6-membered heterocyclic ring; and
$R_6''$ is $C_1$-$C_{15}$ alkyl, $C_2$-$C_{20}$ alkenyl or $C_4$-$C_8$ cycloalkyl.

15. The dry film according to claim 12, wherein a surface of the support carrier that is laminated to the resin layer has an average surface roughness of 0 to 5 μm.

16. A polyimide film prepared from the composition according to claim 1.

17. A polyimide film prepared from the dry film according to claim 14.

18. A method of forming a polyimide laminate having a matting surface, comprising:
(1) laminating the dry film according to claim 14 to a substrate in such a manner that the resin layer of the dry film faces the substrate;
(2) removing the support carrier from the dry film; and
(3) heating to remove the solvent.

19. The method according to claim 18 wherein the amic acid ester oligomer of Formula (1) does not contain any photosensitive group and the method comprises the following steps:
(1) laminating the dry film according to claim 14 to a substrate in such a manner that the resin layer of the dry film faces the substrate;

(2) removing the support carrier from the dry film; and
(3) heating to remove the solvent and imidizing the polyimide precursor composition to form a polyimide.

20. The method according to claim 18 wherein the amic acid ester oligomer of Formula (1) contains a photosensitive group and the method comprises the following steps:
   (1) laminating the dry film according to claim 14 to a substrate in such a manner that the resin layer of the dry film faces the substrate;
   (2) performing exposure;
   (3) removing the support carrier from the dry film;
   (4) performing post-exposure bake to remove the solvent;
   (5) performing development; and
   (6) heating to imidize the polyimide precursor composition into a polyimide.

* * * * *